(12) United States Patent
La Rue et al.

(10) Patent No.: US 6,849,879 B2
(45) Date of Patent: Feb. 1, 2005

(54) CROSSTALK REDUCTION IN A CROSSPOINT THYRISTOR SWITCHING ARRAY USING A SHIELDED DIELECTRIC STACK

(75) Inventors: Ross A. La Rue, Milpitas, CA (US);
Jules D. Levine, Santa Clara, CA (US);
Daniel Curcio, Nashua, NH (US);
Timothy Boles, Tyngsboro, MA (US);
Joel Goodrich, Westford, MA (US);
David Hoag, South Walpole, MA (US);
Noyan Kinayman, Malden, MA (US)

(73) Assignee: Teraburst Networks, Inc., Sunnyvale, CA (US)

( * ) Notice: Subject to any disclaimer, the term of this patent is extended or adjusted under 35 U.S.C. 154(b) by 73 days.

(21) Appl. No.: 10/270,109

(22) Filed: Oct. 15, 2002

(65) Prior Publication Data

US 2003/0075743 A1 Apr. 24, 2003

Related U.S. Application Data

(60) Provisional application No. 60/328,805, filed on Oct. 15, 2001.

(51) Int. Cl.[7] .................... H01L 29/74; H01L 31/111
(52) U.S. Cl. .................... 257/109; 257/177; 257/181; 333/247
(58) Field of Search .................... 257/109, 110, 257/177, 181, 182; 333/247

(56) References Cited

U.S. PATENT DOCUMENTS 5,142,347 A * 8/1992 Voss .................... 257/109
5,719,413 A * 2/1998 Bernier .................... 257/174
5,831,337 A 11/1998 Sato
6,028,348 A 2/2000 Hill

OTHER PUBLICATIONS

T. Edwards, "Foundations of Microstrip Circuit Design" Wiley & Sons, 1995, pp. 1–43.

Copy of International Search Report Issued in Application No. PCT/US02/32665 dated May 3, 2003.

* cited by examiner

Primary Examiner—Ngan V. Ngo
(74) Attorney, Agent, or Firm—Katten Muchin Zavis Rosenman

(57) ABSTRACT

A method and apparatus are disclosed for reducing crosstalk and dispersion in a crosspoint monolithic microwave integrated circuit (MMIC) switch array operating in a range between DC and microwave frequencies. In accordance with an exemplary embodiment, the crosspoint MMIC switch array includes a dielectric stack, a substrate, a first ground plane, a plurality of thyristor switches, a plurality of signal transmission lines arranged in rows; and a plurality of signal transmission lines arranged in columns. The plurality of signal transmission lines arranged in columns intersect the plurality of signal transmission lines arranged in rows at a plurality of intersection points. Each of the plurality of thyristor switches is associated with one of the plurality of intersection points. Each of the plurality of thyristor switches is in electrical contact with the signal transmission lines that intersect at the associated intersection point.

47 Claims, 21 Drawing Sheets

(a)

(b)

(c)

(a)

(b)

CROSSTALK REDUCTION IN A CROSSPOINT THYRISTOR SWITCHING ARRAY USING A SHIELDED DIELECTRIC STACK

This application claims priority under 35 U.S.C. §119 to U.S. Provisional Application No. 60/328,805, filed on Oct. 15, 2001, the entire content of which is hereby incorporated herein by reference.

BACKGROUND

1. Field of the Invention

The present invention relates to switching arrays used for frequencies in a range between DC and microwave. More particularly, the present invention relates to an apparatus and a method for reducing crosstalk and dispersion in a crosspoint monolithic microwave integrated circuit (MMIC) switch array.

2. Background Information

Referring to FIG. 1, a crosspoint monolithic microwave integrated circuit (MMIC) switch array 100 includes thyristor switches 105, an upper dielectric layer 110 and a lower dielectric layer 115, with the lower dielectric layer 115 being positioned upon a substrate 120. Planar connections are made to the upper and lower levels of each thyristor 105. The substrate 120 is made from a semiconductor material, such as gallium arsenide (GaAs). The array is bounded above by an upper ground plane 125 and below by a lower ground plane 130. An example of such a crosspoint MMIC switch array is described in, for example, U.S. patent application Ser. No. 09/788,296 (hereinafter referred to as "T010"), filed on Feb. 16, 2001, entitled "Thyristor Switch for Microwave Signals", and U.S. patent application Ser. No. 09/788,298 (hereinafter referred to as "T011"), filed on Feb. 16, 2001, entitled "Telecommunications Switch Array with Thyristor Addressing."

The respective thicknesses $h_1$ and $h_2$ of the lower dielectric layer 115 and upper dielectric layer 110 can be, for example, 10 $\mu$m. The semiconductor substrate thickness $h_s$ can be approximately 150 $\mu$m and the pitch p can be 150 $\mu$m. The line width w for a 50 ohm line can be 20 $\mu$m. The thyristors 105 are shown as the mesa structures in the figure, and there is one thyristor 105 at each intersection of row transmission lines 135 and column transmission lines 140. For example, if a 64×64 crosspoint MMIC switch array is considered, such an array would have an overall dimension of 150 $\mu$m * 64=0.96 cm=approximately 1.0 cm, thus yielding a die size of approximately 1 cm×1 cm.

With a constant inter-electrode pitch p, crosstalk can be reduced by reducing the thicknesses $h_1$ and $h_2$ of the dielectric layers and reducing the semiconductor substrate thickness $h_s$. This has the desired effect of reducing the line width w consistent with 50 ohm impedance. An additional benefit is increasing the gap between adjacent transmission lines 135 and 140, since the increase in the gap results in higher isolation and lower cross-talk between the adjacent transmission lines 135 and 140. This has the disadvantage, however, of increasing signal insertion loss, because of the increased ohmic losses of the traces, as well as leading to problems with fabrication.

In order to decrease $h_s$ to being less than 150 $\mu$m, it is necessary to etch the semiconductor material, such as GaAs, from the backside after the front-side processing is completed. However, in practice, it is difficult to reduce the thickness of the GaAs substrate sufficiently to where its thickness $h_s$ is small compared to that of the dielectric layer thicknesses $h_1$ and $h_2$ (e.g., 10 $\mu$m). Under laboratory conditions, GaAs can be thinned in small areas to approximately 50 $\mu$m, but in production, GaAs usually has a thickness which is greater than or equal to 150 $\mu$m to avoid breakage of brittle GaAs during subsequent handling.

One type of dielectric material that can be used is benzocyclobutene (BCB). BCB has a dielectric constant of 2.65. A low viscosity form of BCB, marketed as CYCLOTENE™ 4022 by Dow Chemical Company, has a maximum thickness of 5 $\mu$m and a high viscosity BCB, and CYCLOTENE™ 4026, also marketed by Dow Chemical Company, has a maximum thickness of 15 $\mu$m, both of which are the stress limits for these polymers. The result of the above constraints is that microwave transmission as described in the aforementioned U.S. Patent Applications, which occur throughout non-homogeneous media, such as GaAs and dielectric, yields considerable crosstalk and dispersion.

Therefore, there is a need for a design that reduces crosstalk while keeping the pitch relatively small, approximately on the order of 150 $\mu$m, so that 64×64 arrays are possible with a maximum dimension of 64*150 $\mu$m=1.0 cm.

SUMMARY OF THE INVENTION

A method and apparatus are disclosed for reducing crosstalk and dispersion in a crosspoint monolithic microwave integrated circuit (MMIC) switch array operating in a range between DC and microwave frequencies. In accordance with an exemplary embodiment, the crosspoint MMIC switch array includes a dielectric stack, a substrate, a first ground plane, a plurality of thyristor switches, a plurality of signal transmission lines arranged in rows; and a plurality of signal transmission lines arranged in columns. The dielectric stack includes an upper dielectric layer and a lower dielectric layer. The substrate includes a first semiconductor. The first ground plane is positioned between the dielectric stack and the substrate. The plurality of thyristor switches is embedded in the lower dielectric layer. Each of the plurality of thyristor switches has a top and a bottom. The plurality of signal transmission lines arranged in columns intersect the plurality of signal transmission lines arranged in rows at a plurality of intersection points. Each of the plurality of thyristor switches is associated with one of the plurality of intersection points. Each of the plurality of thyristor switches is in electrical contact with the signal transmission lines that intersect at the associated intersection point. The first ground plane includes a plurality of apertures. Each of the plurality of thyristor switches is associated with one of the plurality of apertures.

Each of the plurality of thyristor switches can be positioned inside one of the plurality of apertures, such that short circuiting between the plurality of thyristor switches and the first ground plane is prevented. According to an exemplary embodiment, the top of each of the plurality of thyristor switches can be in electrical contact with one of the plurality of signal transmission lines arranged in rows that intersects at the associated intersection point, and the bottom of each of the plurality of thyristor switches can be in electrical contact with one of the plurality of signal transmission lines arranged in columns that intersects at the associated intersection point. According to an alternative exemplary embodiment, the top of each of the plurality of thyristor switches can be in electrical contact with one of the plurality of signal transmission lines arranged in columns that intersects at the associated intersection point, and the bottom of each of the plurality of thyristor switches can be in electrical contact with one of the plurality of signal transmission lines arranged in rows that intersects at the associated intersection point.

According to an exemplary embodiment, the plurality of signal transmission lines arranged in rows can be positioned substantially on a first plane, and the plurality of signal transmission lines arranged in columns can be positioned substantially on a second plane, where the first plane is substantially parallel to the second plane. According to an alternative exemplary embodiment, the plurality of signal transmission lines arranged in rows can be positioned substantially on a first plane, and the plurality of signal transmission lines arranged in columns can also be positioned substantially on the first plane. At each intersection point, each of the plurality of signal transmission lines arranged in a row can be configured to pass outside of the first plane and below each of the plurality of signal transmission lines arranged in columns.

According to an exemplary embodiment, each of the plurality of thyristor switches can be positioned so that a center axis of each of the plurality of thyristor switches passes through the associated intersection point. According to an alternative exemplary embodiment, each of the plurality of thyristor switches can be positioned so that a center axis of each of the plurality of thyristor switches is offset from the associated intersection point.

The crosspoint MMIC switch array can also include a second ground plane and a plurality of vias. The second ground plane can be positioned such that the substrate is between the first ground plane and the second ground plane. Each of the plurality of vias can extend from the first ground plane to the second ground plane through the substrate. According to an exemplary embodiment, each of the plurality of vias can be positioned substantially equidistant from four of the plurality of thyristor switches.

The first semiconductor can include, for example, either gallium arsenide or silicon. The dielectric stack can include, for example, benzocyclobutene. A width of each of the plurality of signal transmission lines can be chosen such that each of the plurality of signal transmission lines has an impedance substantially equal to a load.

In a second aspect of the present invention, an apparatus is disclosed for reducing crosstalk and dispersion in a crosspoint MMIC switch array operating in a range between DC and microwave frequencies. The apparatus includes a crosspoint MMIC switch array comprising a dielectric stack, a substrate, a first ground plane, a plurality of thyristor switches, a plurality of signal transmission lines arranged in rows, and a plurality of signal transmission lines arranged in columns. The dielectric stack includes an upper dielectric layer and a lower dielectric layer. The substrate includes a first semiconductor. The plurality of thyristor switches is embedded in the lower dielectric layer. Each of the plurality of thyristor switches has a top and a bottom. The plurality of signal transmission lines arranged in columns intersects the plurality of signal transmission lines arranged in rows at a plurality of intersection points. The apparatus includes means for associating each of the plurality of thyristor switches with one of the plurality of intersection points and means for placing each of the plurality of thyristor switches into electrical contact with the signal transmission lines that intersect at the associated intersection point. The apparatus also includes means for positioning the first ground plane between the dielectric stack and the substrate, means for inserting a plurality of apertures in the first ground plane, and means for associating each of the plurality of thyristor switches with one of the plurality of apertures.

In a third aspect of the present invention, a method is disclosed for reducing crosstalk and dispersion in a crosspoint MMIC switch array operating in a range between DC and microwave frequencies. According to exemplary embodiments, each of a plurality of thyristor switches is associated with one of a plurality of intersection points. A plurality of signal transmission lines is arranged in rows and a plurality of signal transmission lines is arranged in columns, such that the plurality of signal transmission lines arranged in columns intersect with the plurality of signal transmission lines arranged in rows at the plurality of intersection points. The plurality of thyristor switches are embedded in a lower dielectric layer of a dielectric stack. The dielectric stack includes the lower dielectric layer and an upper dielectric layer, and each of the plurality of thyristor switches has a top and a bottom. Each of the plurality of thyristor switches is placed into electrical contact with the signal transmission lines that intersect at the associated intersection point. A first ground plane is positioned between the dielectric stack and the substrate, wherein the substrate includes a first semiconductor. A plurality of apertures is inserted in the first ground plane. Each of the plurality of thyristor switches is associated with one of the plurality of apertures. A width of each of the plurality of signal transmission lines is selected such that each of the plurality of signal transmission lines has an impedance substantially equal to a load.

The step of associating each of the plurality of thyristor switches with one of the plurality of apertures can include the step of preventing short circuiting between the plurality of thyristor switches and the first ground plane by positioning each of the plurality of thyristor switches inside one of the plurality of apertures. According to an exemplary embodiment, the step of placing each of the plurality of thyristor switches into electrical contact with the signal transmission lines that intersect at the associated intersection point can include the steps of placing the top of each of the plurality of thyristor switches into electrical contact with one of the plurality of signal transmission lines arranged in rows that intersects at the associated intersection point, and placing the bottom of each of the plurality of thyristor switches into electrical contact with one of the plurality of signal transmission lines arranged in columns that intersects at the associated intersection point.

According to an alternative exemplary embodiment, the step of placing each of the plurality of thyristor switches into electrical contact with the signal transmission lines that intersect at the associated intersection point can include the steps of placing the top of each of the plurality of thyristor switches into electrical contact with one of the plurality of signal transmission lines arranged in columns that intersects at the associated intersection point, and placing the bottom of each of the plurality of thyristor switches into electrical contact with one of the plurality of signal transmission lines arranged in rows that intersects at the associated intersection point.

According to an exemplary embodiment, the method can also include the steps of positioning the plurality of signal transmission lines arranged in rows substantially on a first plane and positioning the plurality of signal transmission lines arranged in columns substantially on a second plane, wherein the first plane is substantially parallel to the second plane. According to an alternative exemplary embodiment, the method can include the steps of positioning the plurality of signal transmission lines arranged in rows substantially on a first plane, positioning the plurality of signal transmission lines arranged in columns substantially on the first plane, and, at each associated intersection point, configuring each of the plurality of signal transmission lines arranged in rows to pass outside of the first plane and below each of the plurality of signal transmission lines arranged in columns.

According to exemplary embodiments, the step of associating each of the plurality of thyristor switches with one of the plurality of intersection points can include the step of positioning each of the thyristor switches so that a center axis of each thyristor switch passes through the associated intersection point. According to an alternative exemplary embodiment, the step of associating each of the plurality of thyristor switches with one of the plurality of intersection points can include the step of positioning each of the plurality of thyristor switches so that a center axis of each of the plurality of thyristor switches is offset from the associated intersection point.

The method can include the steps of positioning a second ground plane such that the substrate is between the first ground plane and the second ground plane, and extending each of a plurality of vias from the first ground plane to the second ground plane through the substrate. The method can also include the step of positioning each of the plurality of vias to be substantially equidistant from four of the plurality of thyristor switches.

According to exemplary embodiments, the first semiconductor can include, for example, either gallium arsenide or silicon. The dielectric stack can include, for example, benzocyclobutene. The frequency range of operation is from DC to microwave frequencies (approximately 300 MHz to approximately 300 GHz). According to exemplary embodiments, the method can also include the step of selecting a width of each of the plurality of signal transmission lines such that each of the plurality of transmission lines has an impedance substantially equal to that of the load, which can be of the order of, for example, 50 ohms.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

A method and apparatus are disclosed for reducing crosstalk and dispersion in a crosspoint monolithic microwave integrated circuit (MMIC) switch array operating in a range between DC and microwave frequencies. In accordance with an exemplary embodiment, the crosspoint MMIC switch array includes a dielectric stack, a substrate, a first ground plane, a plurality of thyristor switches, a plurality of signal transmission lines arranged in rows; and a plurality of signal transmission lines arranged in columns. The plurality of signal transmission lines arranged in columns intersect the plurality of signal transmission lines arranged in rows at a plurality of intersection points. Each of the plurality of thyristor switches is associated with one of the plurality of intersection points. Each of the plurality of thyristor switches is in electrical contact with the signal transmission lines that intersect at the associated intersection point. Each of the plurality of thyristor switches is located in the vicinity of plated vias in the nearby substrate region to eliminate substrate mode excitation and thereby reduce crosstalk and insertion loss.

Accordingly, a new design for greatly reducing crosstalk and dispersion in a MMIC thyristor switching array used in a frequency range of between DC and microwave (approximately 300 MHz to approximately 300 GHz) is provided. First, a semiconductor substrate is used to grow epitaxial layers that create thyristor mesa structures. Each thyristor acts as a large bandpass switch (having substantially uniform insertion loss at frequencies over the range from DC to microwave) at each node in a crosspoint switching array. Next, a dielectric stack is added atop the semiconductor for the purpose of interconnecting the thyristors with orthogonal and non-intersecting transmission lines. The stack includes: (1) a ground plane directly on the semiconductor surface with apertures located at each thyristor site; (2) a first level dielectric layer; (3) a plurality of substantially parallel metal conductor stripes; (4) a plurality of substantially parallel metal conductor stripes aligned in the orthogonal direction with out-of-plane crossing; (5) a second level dielectric layer; and (6) vias for eliminating substrate mode excitation. The thyristors extend from the semiconductor substrate through an array of apertures in the ground plane. The substrate with high dielectric constant is effectively shielded by the ground plane from the dielectric stack with low dielectric constant, which increases line-to-line isolation.

Figure 2:
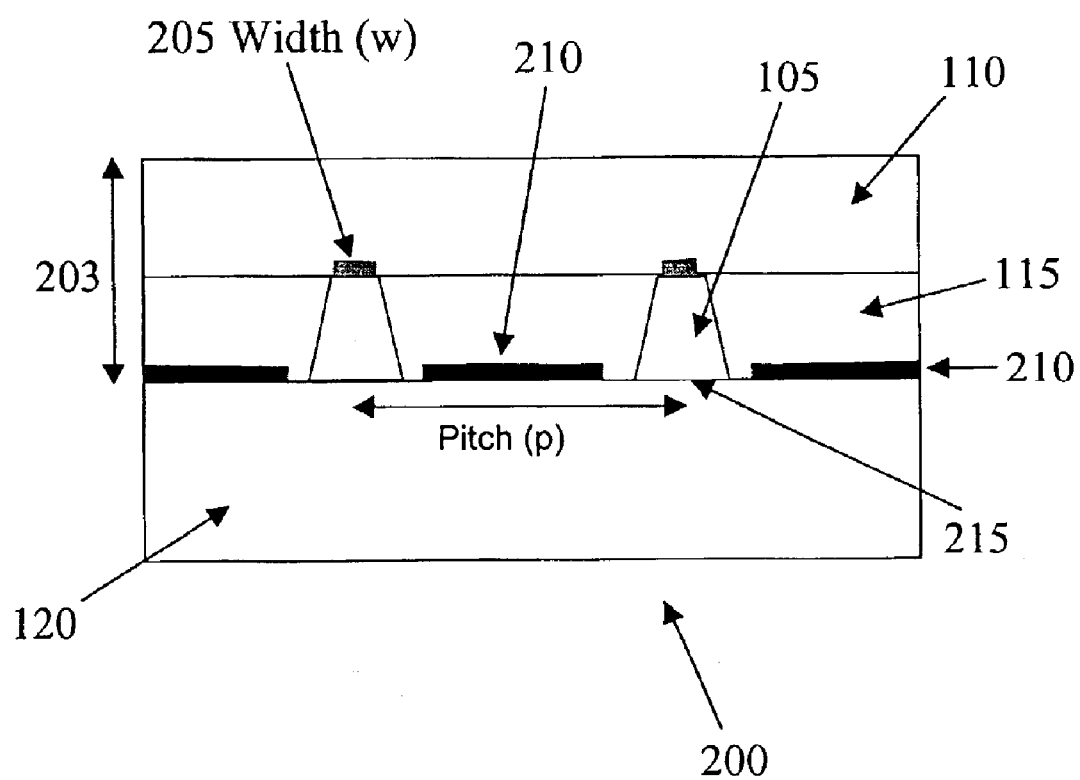
FIG. 2 illustrates a side view of a MMIC composed of thyristor switches including a ground plane between a semiconductor substrate and a dielectric stack, in accordance with an exemplary embodiment of the present invention.

Referring to FIG. 2, a design 200 of a MMIC composed of thyristor switches having a ground plane between a semiconductor substrate and a dielectric stack is illustrated, in accordance with an exemplary embodiment of the present invention. The exemplary design in FIG. 2 illustrates several rather complex geometric features of the present invention. The drawing of FIG. 2 depicts a side view and a top view of adjacent metal stripe electrodes serving as a transmission lines arranged in rows 135 and in columns 140.

A dielectric stack 203 includes a lower and an upper dielectric materials 115 and 110 of thicknesses $h_1$ and $h_2$, respectively, with dimensions of, for example, 6.5 µm each. Also shown are transmission lines 205 and a ground plane 210. There are apertures 215 in the ground plane 210 that allow the mesa thyristors 105 to penetrate into the dielectric stack 203. The aperture areas can be minimized to achieve the greatest possible fractional area of ground plane, consistent with the requirement that the ground plane 210 should not short out the thyristor mesa 105 at its base.

Figure 1:
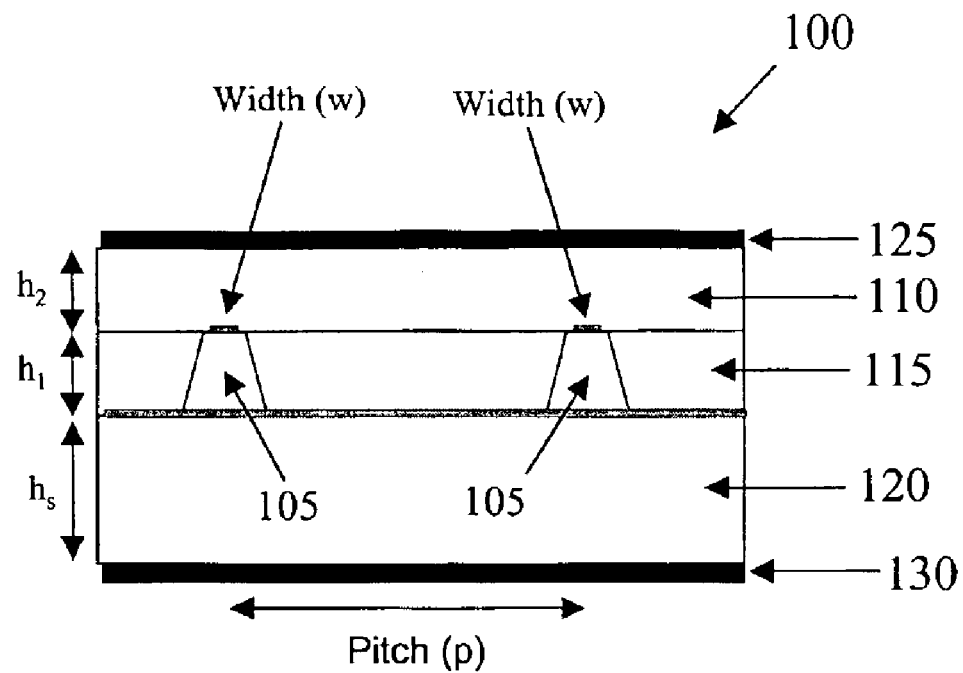
FIG. 1 illustrates a side view and a top view of a monolithic microwave integrated circuit (MMIC) composed of thyristor switches with a gallium arsenide substrate.
Figure 1:
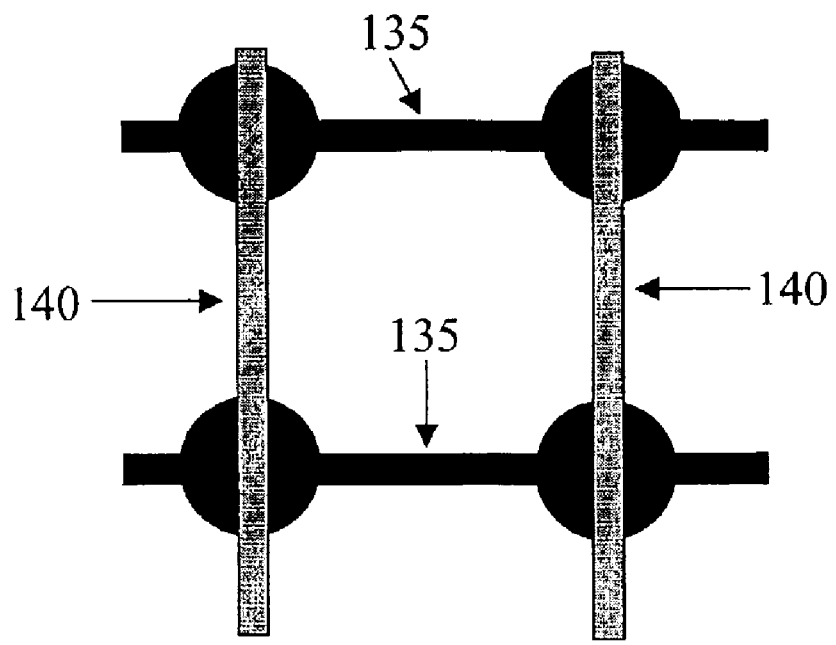

A difference between the exemplary design of FIG. 2 and the design of FIG. 1 is the addition of the ground plane 210 between the semiconductor substrate 120 and the dielectric stack 203. The ground plane 210 terminates most of the field lines originating in the dielectric stack 203 atop the semiconductor substrate 120. The result of this shielding is that the gallium arsenide (GaAs) semiconductor becomes substantially electrically invisible. For example, for purposes of illustration and not limitation, consider lateral line-to-line coupling in a semiconductor such as GaAs with dielectric constant $\in_r=12.9$ and a dielectric such as BCB with dielectric constant $\in_r=2.65$. The lateral crosstalk voltage is, for example, $12.9/2.65=4.8$ times as large for the semiconductor, as compared to the dielectric. This corresponds to a lateral crosstalk power ratio of 13.6 dB.

Another difference between the designs shown in FIGS. 2 and 1 is the absence of the upper ground plane 125 atop the dielectric stack 203 in FIG. 2. It is known to those versed in the art that parallel microstrip transmission lines within homogeneous media having equal dielectric constants uniform dielectric above and below the microstrip metallization trace provide greater isolation than would be the case for non-uniform dielectric media. Similarly, it is known to those versed in the art that parallel stripline transmission lines within homogeneous media having uniform dielectric above and below the stripline metallization trace provide greater isolation than would be the case for non-uniform dielectric media. It is known that stripline has one of the best isolation characteristics. Since the dielectric constants of benzocyclobutene (BCB) and air are very similar, especially compared to the reference case of GaAs and air, the difference between stripline and microstrip is minimal, so there is no appreciable penalty to be paid for the simpler structure shown in FIG. 2. Additionally, the presence of an upper ground plane as in stripline would require the use of vias to connect the upper and lower ground planes at each unit cell. These complications are avoided in the design of FIG. 2.

Another difference between the designs shown in FIGS. 2 and 1 is the doubling of the signal line width in the single ground plane design 200 shown in FIG. 2, as compared with the dual ground plane design 100 shown in FIG. 1. This occurs because the capacitance from a signal line 205 of width w to a single ground plane is half that of a dual ground plane with one ground plane below the signal line and one above it at the same distance apart. In order to maintain a 50 ohm transmission line, the line width of the single ground plane is doubled, as compared to that of the dual ground plane. This decreases the insertion loss for the single ground plane design compared with the dual ground plane design. Given that the insertion loss can be appreciable at high frequencies, the ability to double the signal line width reduces the insertion loss by due to the skin effect.

Stripline occurs in a uniform dielectric medium in between two ground planes and is characterized by a transverse electromagnetic (TEM) mode, with the best possible isolation and lowest possible dispersion. Microstrip occurs in a non-homogeneous dielectric medium such as described above with respect to FIG. 2. Microstrip closely resembles stripline, because on the upper face of the dielectric stack 203, the dielectric constant of BCB (i.e., 2.65) is very similar to that of air (i.e., 1.00), and at the lower face of the dielectric stack 203, there is a ground plane 210 which prevents the field lines emanating from the signal lines 205 in the dielectric stack 203 from penetrating downwards into the dissipating high dielectric semiconductor, which has a dielectric constant of approximately 12.9. Therefore, the transmission mode is "Quasi-TEM", as described in, for example, "Foundations of Microstrip Circuit Design" by T. Edwards, Wiley & Sons, Chichester, England, 1995 at pages 1–43. Quasi-TEM is very similar to TEM, in that both modes are characterized by good crosstalk suppression.

Figure 3:
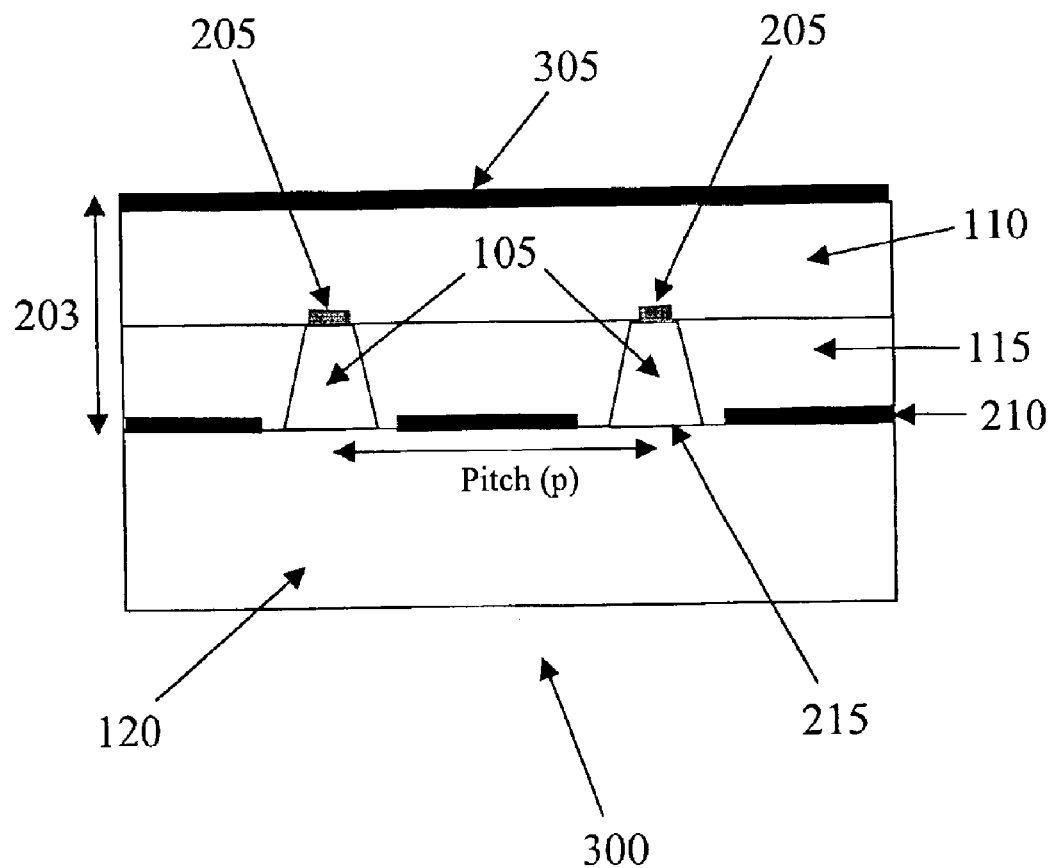
FIG. 3 illustrates an alternative side view of a MMIC composed of thyristor switches including an upper ground plane, in accordance with an alternative exemplary embodiment of the present invention.

Referring to FIG. 3, with little loss of generality, it is possible to consider an alternative exemplary design 300 having an upper ground plane 305 atop the dielectric stack 203. In this alternative exemplary embodiment, the dielectric stack may be composed of two different dielectric materials with substantially equal dielectric constants. The design 300 has the benefit of making the transmission line 205 appear more like a stripline than microstrip, with the additional benefit of lower crosstalk and dispersion. However, due to the capacitance produced by the two ground planes, the transmission line width w of FIG. 3 is half that of FIG. 2, which leads to double the insertion loss in the design 300 as compared to the insertion loss of the design 200. Therefore, the design 300 can be used in situations where the signal attenuation is less important than noise reduction. In general, however, the design 200 of FIG. 2 is the preferred embodiment of the present invention.

Figure 4:
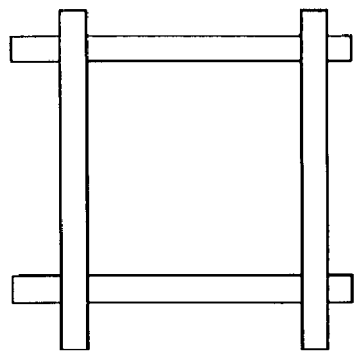
FIGS. 4(a), (b), and (c) show three options for crossover design of transmission lines to be used with the MMIC, in accordance with an exemplary embodiment of the present invention.
Figure 4:
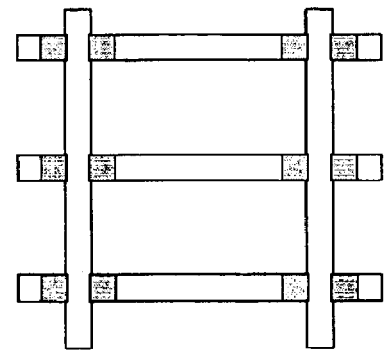
Figure 4:
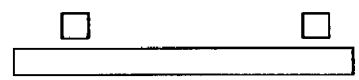
Figure 4:
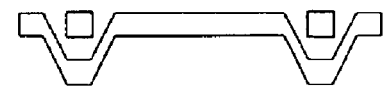
Figure 4:
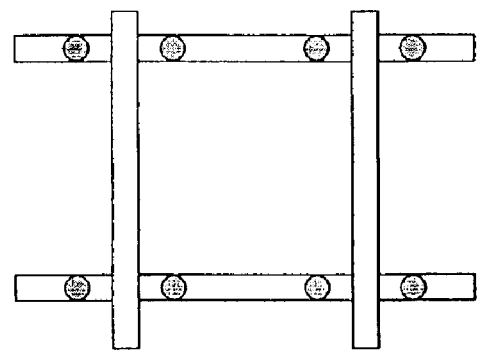
Figure 4:
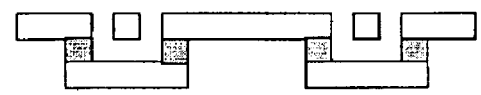

Referring to FIG. 4, three alternative exemplary embodiments for crossover design of the transmission lines 205 are shown. In FIG. 4(*a*), an array of rows is on one plane and an array of columns is on another plane. This design is a simple, independent superposition of two orthogonal linear arrays at two different levels.

In the alternative exemplary embodiment shown in FIG. 4(*b*), the array of rows and columns lie on the same nominal plane, with the rows dipping below the columns at each intersection point where the rows meet the columns. In the plan view of the upper part of FIG. 4(*b*), the row depression at each intersection is shown schematically as the shaded area. In the elevation view of the lower part of FIG. 4(*b*), the interleaving geometry is shown most clearly in the shape of a ramp. This interleaved structure is geometrically more complex than the structure shown in FIG. 4(*a*). However, the interleaved structure of FIG. 4(*b*) has the advantage that it is filly coplanar for most of the structure, except near the intersection points, which are more complex and which must be considered separately.

In the alternative exemplary embodiment shown in FIG. 4(*c*), vias are used to replace each ramp of FIG. 4(*b*). The structure of FIG. 4(*c*) has the same functionality as that of FIG. 4(*b*), and differs only in details of design. For purposes of the following discussion, both FIGS. 4(*b*) and 4(*c*) will be referred to as interleaved structures.

Thyristor Location in Unit Cell

Figure 5:
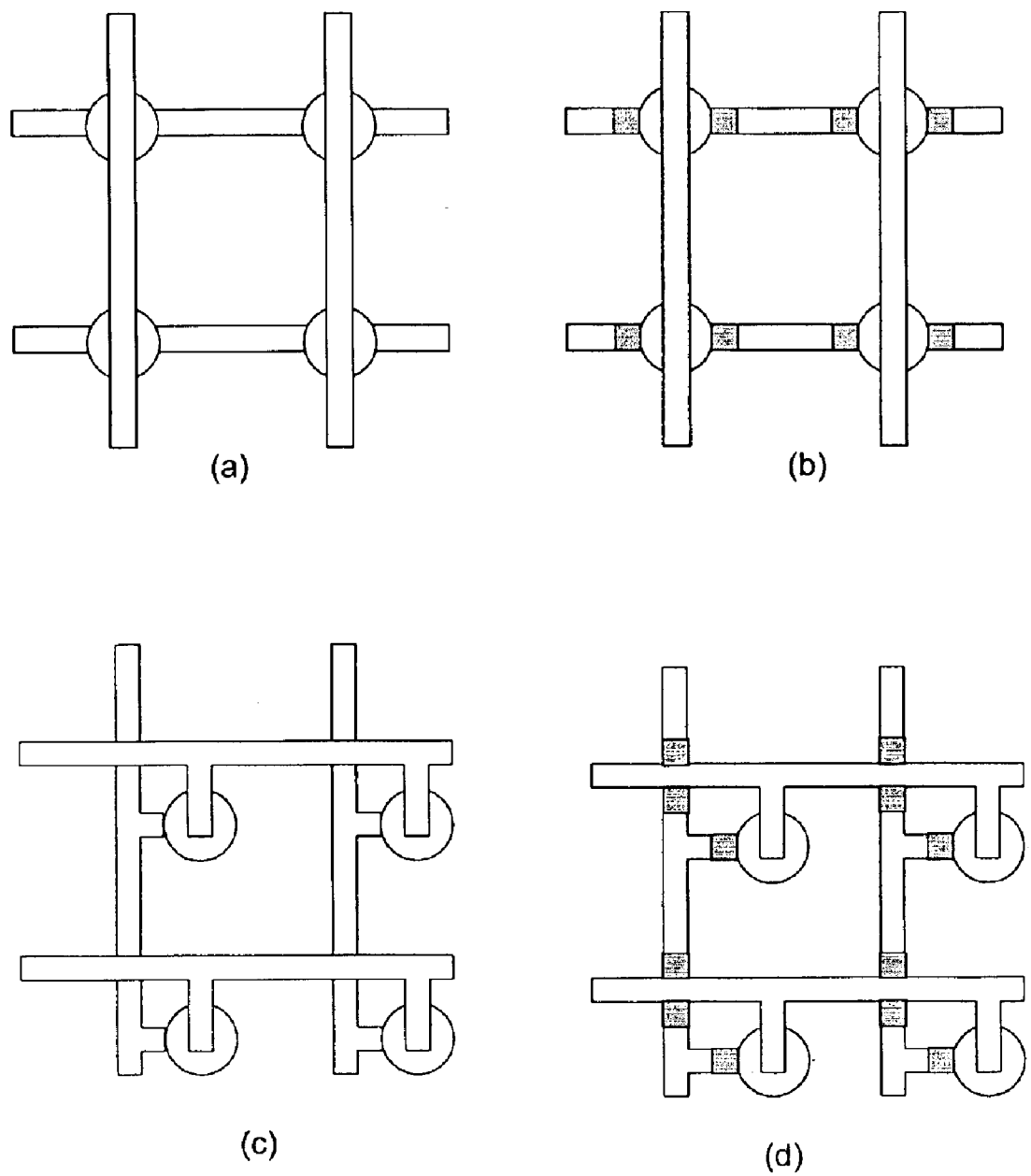
FIGS. 5(a)–(d) show four orientations of a location of a thyristor within a unit cell of the MMIC, in accordance with an exemplary embodiment of the present invention.

There are two types of thyristor locations in a unit cell—centered and offset. There are two types of crossover designs—independent and interleaved. Referring to FIG. 5, examples of the four possible combinations of thyristor locations and crossover designs are illustrated.

Referring to FIGS. 5(*a*) and 5(*b*), a centered thyristor location is illustrated. In these two drawings, a thyristor can be centered at the intersection point of each of the rows and columns. The row can be attached to the top of the thyristor mesa and the column can be attached to the base of the mesa to complete the crosspoint switch MMIC design.

Referring to FIGS. 5(*c*) and 5(*d*), an offset thyristor location is illustrated. In these drawings, a thyristor can be offset from the intersection point of each of the rows and columns. Each row can be attached with a stub to the top of the thyristor mesa and each column can be attached with a stub to the base of the mesa to complete the crosspoint switch MMIC design.

The structures illustrated in FIGS. 5(*a*) and 5(*c*) can have independent crossovers, as illustrated in FIG. 4(*a*), while the structures of FIGS. 5(*b*) and 5(*d*) can have interleaved crossovers, as illustrated in either FIG. 4(*b*) or FIG. 4(*c*).

Ground Plane

In all of the designs described previously, the ground plane is located at the base of each thyristor. However, apertures 215 can be included in the ground plane 210 to avoid short circuits between the ground plane 210 and the base of the thyristor 105 and short circuits between the ground plane 210 and the interleaved columns of FIGS. 5(*b*) and (*d*).

Figure 6:
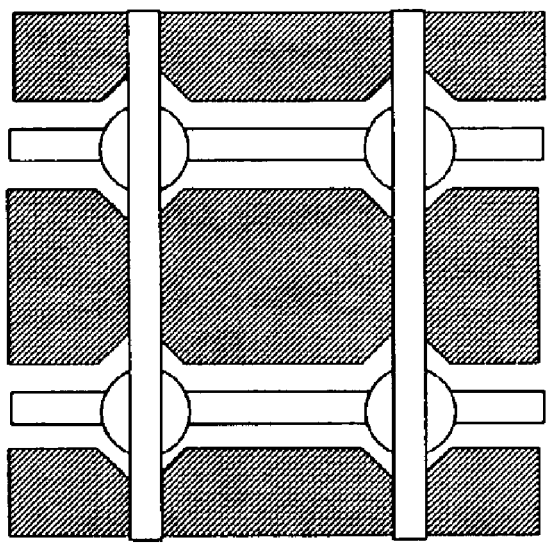
FIGS. 6(a) and (b) show two ground plane orientations for the MMIC, in accordance with an exemplary embodiment of the present invention.
Figure 6:
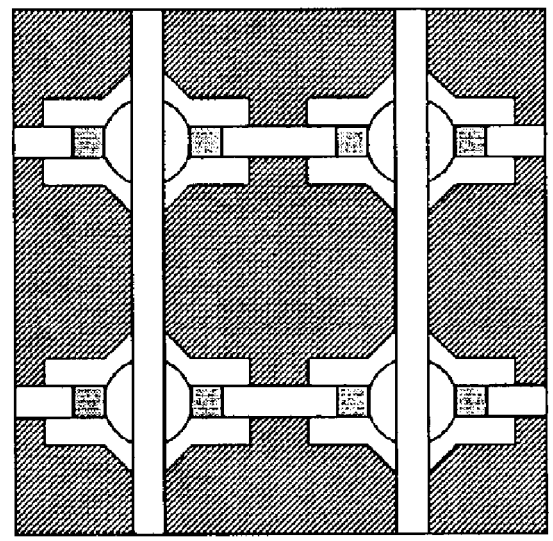

Referring to FIG. 6(*a*), another view of the FIG. 5(*a*) structure with a ground plane having apertures is illustrated. The ground plane is shown with diagonal cross-hatching. FIG. 6(*a*) applies to the centered thyristor location with the independent crossover structure. The ground plane avoids touching both the thyristors and the row lines connecting the thyristor pedestals. The ground plane can have segmented horizontal sections which are discontinuous. According to this design, the ground plane sections can be connected with vias (not shown) to a continuous top ground plane at another level, for example, above the dielectric stack.

FIG. 6(*b*) applies to the centered thyristor location with the interleaved crossover structure, as also shown in FIG. 5(*b*). The ground plane also avoids touching both the thyristors and the row lines connecting the thyristor pedestals. The ground plane is spaced apart from the thyristors and lies on a plane beneath the plane of the rows, except at the intersections, where the rows dip to the level of the ground plane to cross under the columns. As a result, the ground plane is continuous in this design. The continuous ground plane of FIG. 6(*b*) is preferable to a segmented ground plane, as shown in FIG. 6(*a*).

Substrate Modes

It is possible for microwave radiation to leak from one row or column to another, for example, through the apertures 215 in the ground plane. This is a deleterious effect and is referred to as "substrate mode excitation." Substrate mode excitation results in increased insertion loss at the frequency of the substrate mode excitation.

Figure 7:
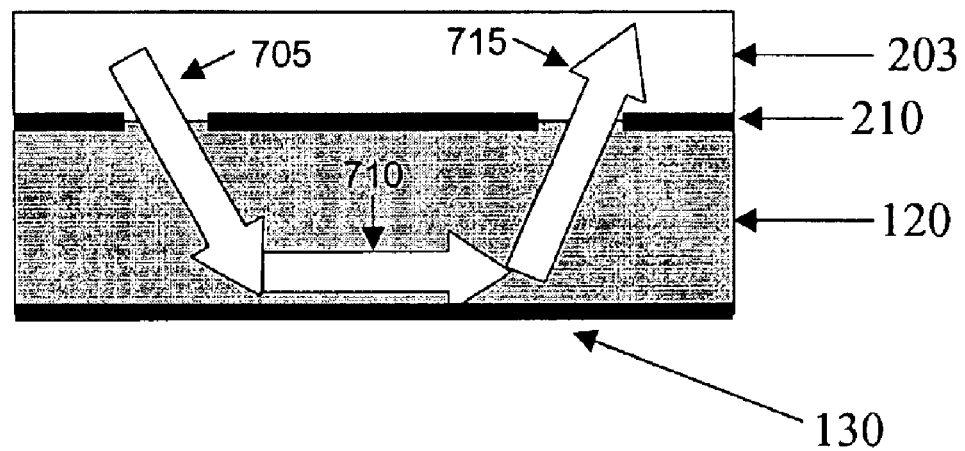
FIG. 7 illustrates substrate mode excitation that generates crosstalk between adjacent apertures in a ground plane of the MMIC, in accordance with an exemplary embodiment of the present invention.

Referring to FIG. 7, a schematic illustration of substrate mode excitation is shown. Microwave signals from an electrode near the aperture on the left side of the figure enter the high dielectric semiconductor substrate 120, as shown by a bold arrow 705. Once in the high dielectric substrate 120, the signals can be transported laterally as shown by a bold arrow 710. Finally, some of the signal can be transported from the substrate 120 through the aperture on the right side of the figure, as shown by a bold arrow 715, to re-enter the dielectric stack 203 on the right. The presence of this signal in the wrong place appears as a noise source, creating crosstalk. Substrate modes have a well-defined frequency dependence, similar to, for example, acoustic excitations on a drumhead. When the signal frequency equals the substrate mode frequency, for a certain spacing between apertures, then the magnitude of the crosstalk can also be large.

Figure 8:
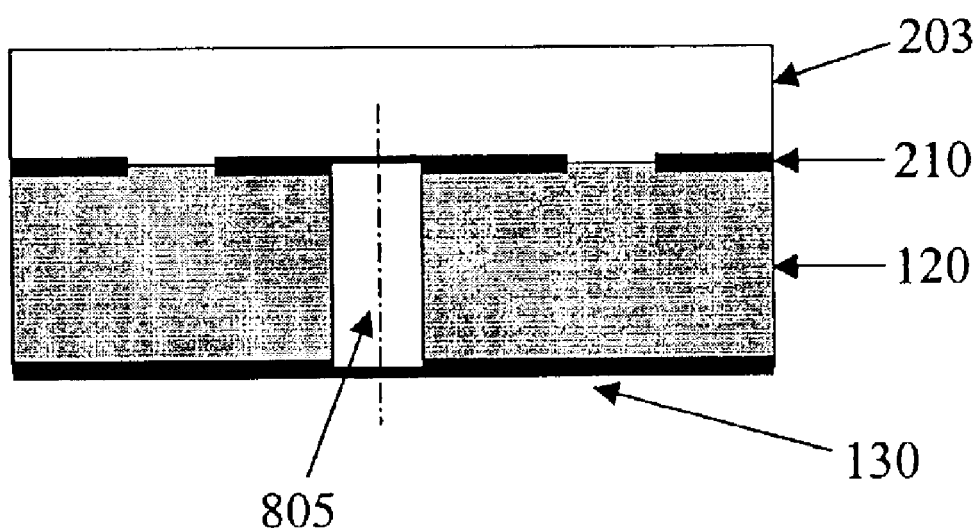
FIG. 8 illustrates an elimination of substrate modes through the use of a via, in accordance with an exemplary embodiment of the present invention.

Referring to FIG. 8, in order to eliminate the substrate modes and reduce the crosstalk, an array of vias 805 can be introduced between the ground planes. For purposes of illustration and not limitation, a single via is shown in the center, in between adjacent apertures. The via 805 can be cylindrical and can be conductive to create a short circuit between the upper and lower ground planes 110 and 115, respectively. It is noted that in FIG. 8, there are no crosstalk arrows, and this is representative of crosstalk elimination due to elimination of substrate modes. A similar via 805 can be located at every unit cell, every other unit cell, or any other periodic arrangement in order to eliminate the substrate modes.

Figure 9:
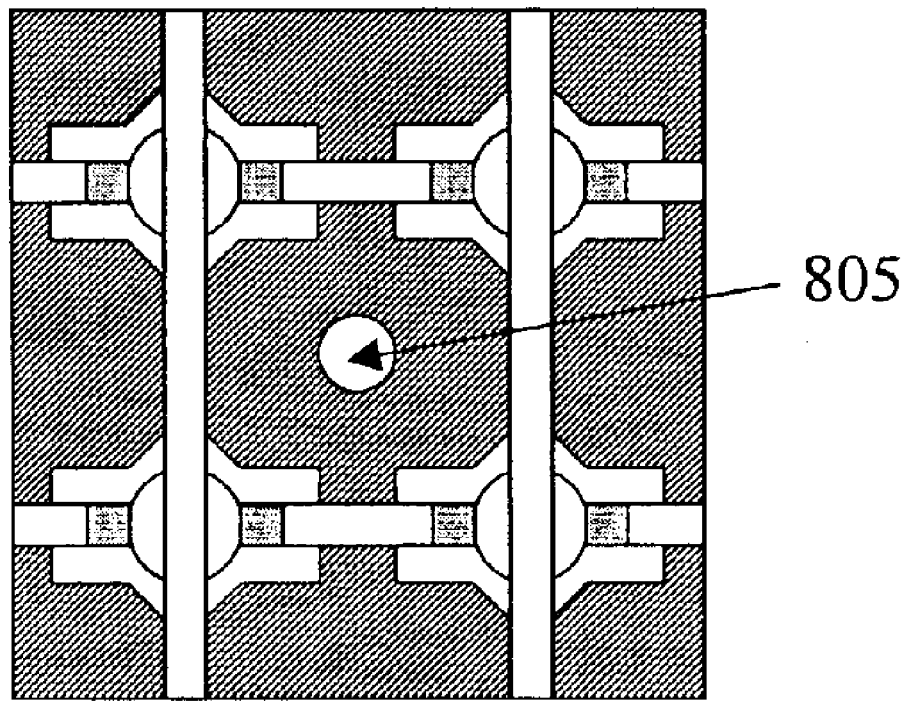
FIG. 9 illustrates an elimination of substrate modes through the use of a via at the center of a unit cell, in accordance with an exemplary embodiment of the present invention.

Referring to FIG. 9, each via 805 can be positioned at a location substantially equidistant from the four thyristors in a unit cell. Each via 805 can contact the metallized upper and lower surfaces of the metallized semiconductor substrate 120 in order for the effect to optimized. A plurality of such vias 805 can be used to break up the substrate modes. At higher frequencies, the density of vias increases. For example, at a frequency of 40 GHz, the vias 805 occupy approximately 10% of the cells.

Figure 10:
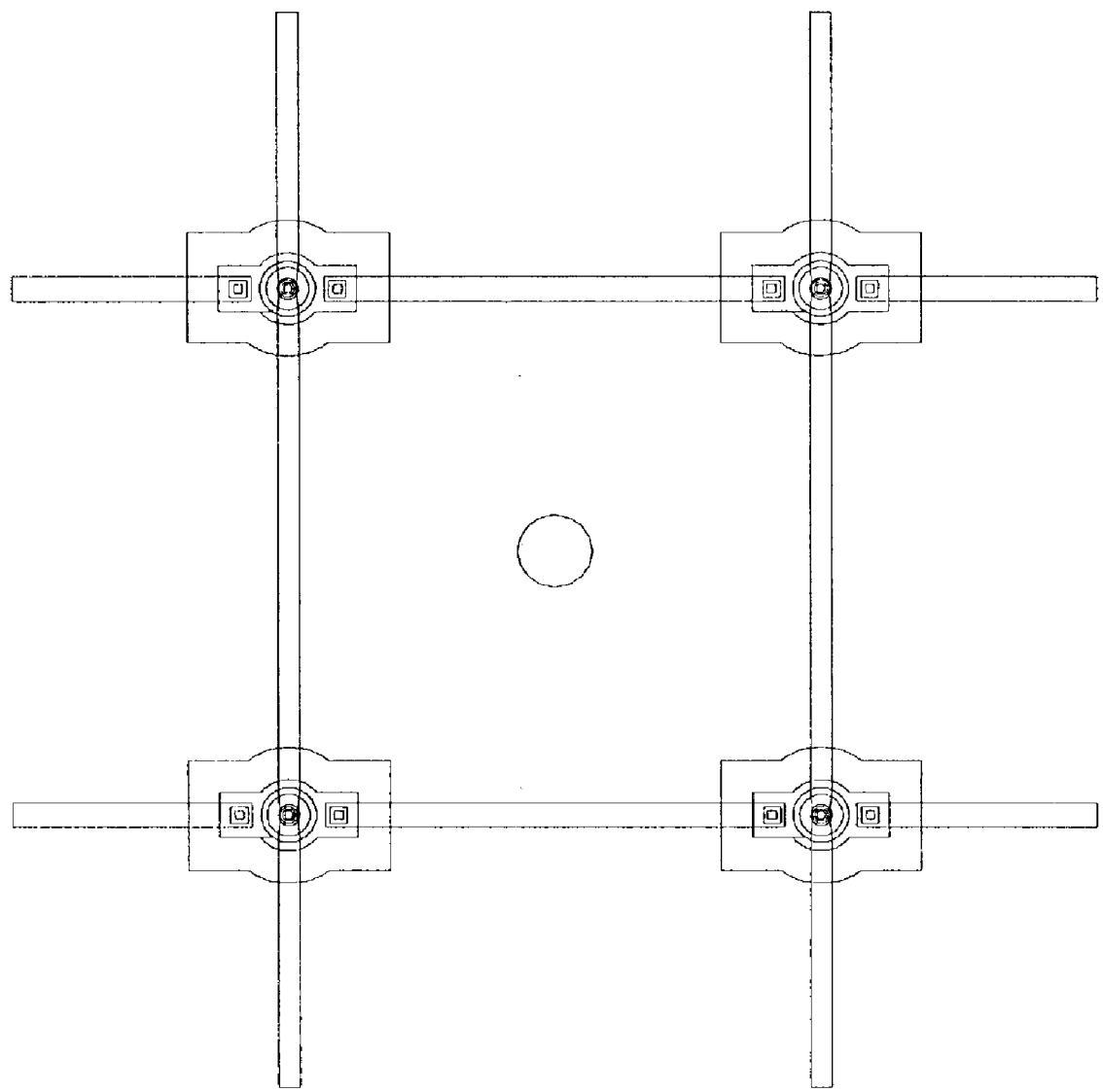
FIG. 10 illustrates a schematic layout, in accordance with an exemplary embodiment of the present invention.

Referring to FIG. 10, a detailed drawing of the layout of an exemplary embodiment of the present invention is illustrated. A 2×2 unit cell is shown to scale, following the conceptual design of FIG. 9, where the thyristors are located at the intersection point and where the rows have a width of approximately 12 μm, the columns have a width of approximately 10 μm, and the pitch is approximately 250 μm.

To minimize crosstalk on a semiconductor with high dielectric constant, a shielded dielectric stack is used with a dielectric constant and a thickness that are both very small compared to those of a semiconductor substrate material, such as GaAs. The benefit is that the crosstalk noise of the shielded dielectric stack is appreciably reduced compared to previous versions of microwave thyristor crosspoint switches. Structural properties can include any one or combination of the following:

(1) the MMIC can include a substrate semiconductor, such as, for example, GaAs and a dielectric stack composed of row and column electrodes embedded in a dielectric material, such as, for example, BCB;
(2) a ground plane can be located between the substrate and the dielectric stack, where the primary purpose of the ground plane is to reduce crosstalk between adjacent lines in the dielectric stack;
(3) apertures can be placed in the ground plane to avoid short-circuiting of the ground plane to the base of each thyristor positioned in a regular array;
(4) metal rows and metal columns can be deposited atop the first layer of dielectric material;
(5) the metal rows can contact the bottom of the thyristors, and the metal columns can contact the tops of the thyristors (or vice versa);
(6) the metal rows can pass under the metal columns (or vice versa) to avoid short-circuiting at the row-column intersections;
(7) additional apertures can be included in the ground plane, if necessary, to allow for the above without short circuits;
(8) the row and column widths can be designed to satisfy the condition of 50 ohm transmission line impedance;
(9) vias can be selectively placed between the apertured ground plane on the upper semiconductor surface and the lower ground plane on the lower semiconductor surface to eliminate substrate modes that can otherwise cause additional crosstalk;
(10) the density and layout of vias can be optimized to minimize crosstalk while guaranteeing mechanical integrity during subsequent handling; and
(11) the transmission line width w can be made to be as wide as possible by using only one ground plane at the juncture between the semiconductor and the dielectric stack.

Modeling Theory

Crosstalk increases noise, and insertion loss decreases signal power. A metric for device performance is signal-to-noise (S/N) ratio, where S is the peak signal voltage, which is conservatively determined at the longest path in the crosspoint MMIC switch array that has the most insertion loss, and N is the root mean square (RMS) value of noise in voltage units. Noise can arise from crosstalk in this type of switch array. There are various different kinds of crosstalk in a crosspoint MMIC switch array, and each gives rise to noise. Noise source n has a standard deviation $\sigma_n$. Assuming there are M such sources with Gaussian distributions, they can be added in quadrature to give an overall noise figure and a S/N ratio given below by Equation (1):

$$S/N = S \Big/ \sqrt{\sum_{n=0}^{M} \sigma_n^2} \qquad (1)$$

In the following analysis, various values of S/N ratio are provided in tabular form. The relationship between S/N and bit error rate (BER) is generally complex, but it is generally understood among those skilled in the art that for Gaussian noise sources, a BER of $10^{-15}$ corresponds to a S/N ratio of 18. If S/N is less than 18, then it is still possible to attain a low BER on the order of $10^{-15}$ by using Forward Error Correction (FEC). There are many kinds of FEC, depending on the codes used. The comparisons below will be done in the absence of FEC.

Figure 11:
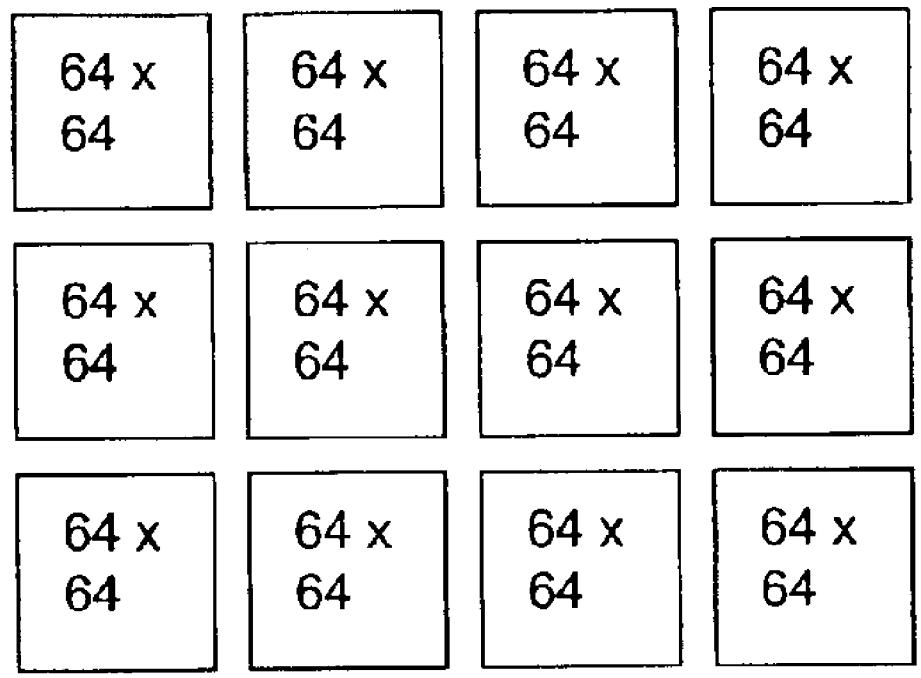
FIG. 11 illustrates an illustration of a tiled 256×256 array using 64×64 switch tiles, in accordance with an exemplary embodiment of the present invention.

Referring to FIG. 11, for purposes of comparison of different designs, a 256×256 array size is assumed. Such an array can be constructed by tiling together sixteen 64×64 chips. Furthermore, a maximum signal frequency of 10 GHz is assumed, thus corresponding with OC-192 data rates.

Table 1 below presents the results of simulations for three designs. The Reference Cases of T010 and T011 use $h_s$=150 μm, $h_1$ and $h_2$=10 μm, and row and column trace widths w=20 μm. The Reference Case of T013 uses $h_1$=150 μm, $h_2$=10 μm, and $h_s$=150 μm, with a GaAs substrate and GaAs upper dielectric layer. The present invention uses $h_s$=150 μm, and $h_1$ and $h_2$=10 μm, where $h_s$ is the substrate thickness, $h_1$ is the superstrate thickness, and $h_2$ is the thickness of the BCB layer that supports the row and column traces.

TABLE 1

EVALUATION OF VARIOUS DESIGNS BASED ON SIGNAL-TO-NOISE RATIO AT A CONSTANT PITCH OF P = 150 μm, AND AN ARRAY SIZE = 256 × 256 AT 10 GHz.

| DESIGN | INSERTION LOSS | CROSSTALK | CROSSTALK S/N |
| --- | --- | --- | --- |
| Reference Cases: T010 and T011 | −27 dB | −39 dB | 12 dB |
| Reference Case: T013 | −20 dB | −26 dB | 6 dB |
| Present Invention: FIG. 10 | −23 dB | −41 dB | 18 dB |

From Table 1, it can be seen that the Reference Cases of T010 and T011 yield a crosstalk S/N ratio of 12 dB. Assuming that crosstalk is the only source of noise in the array, this corresponds to a BER of approximately $10^{-4}$. This is an unacceptably high BER for data rates of 10 Gb/s, i.e., OC-192 data. The crosstalk S/N ratio of Reference Case T013 is only 6 dB, which yields an even worse BER. Finally, the crosstalk S/N of the preferred embodiment of the present invention is 18 dB, which yields a BER of approximately $10^{-15}$. The simulation of the present invention yields a 6 dB improvement over the T010 and T011 cases, effectively reducing the BER to negligibly low levels even at a 10 Gb/s data rate.

Method for Reducing Crosstalk and Dispersion in a Crosspoint MMIC Switch Array

Figure 12:
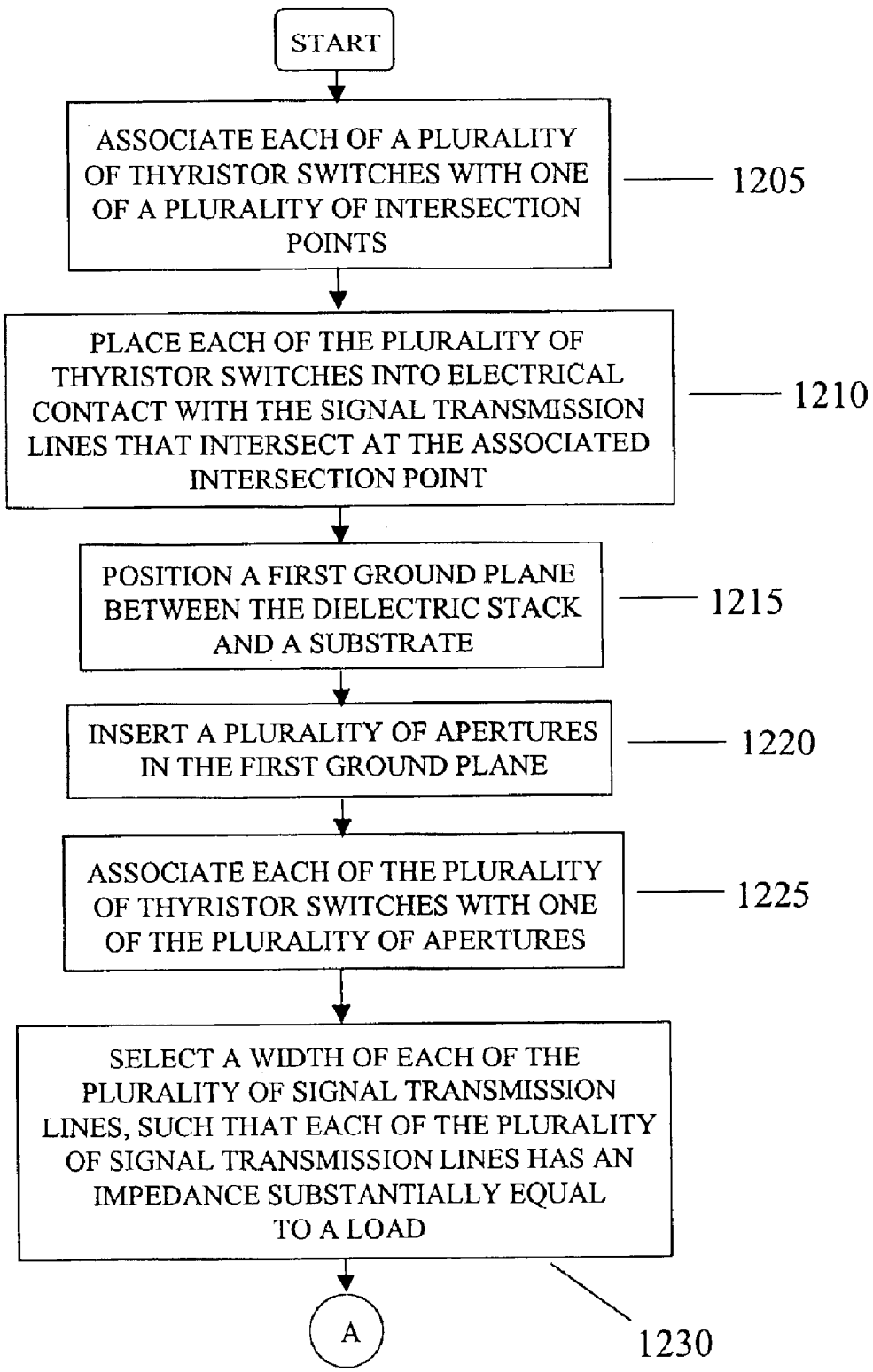
FIG. 12 is a flowchart illustrating steps for reducing crosstalk and dispersion in a crosspoint MMIC switch array, in accordance with an exemplary embodiment of the present invention.

FIG. 12 is a flowchart illustrating steps for reducing crosstalk and dispersion in a crosspoint MMIC switch array, in accordance with an exemplary embodiment of the present invention. In step 1205, each of a plurality of thyristor switches is associated with one of a plurality of intersection points. According to exemplary embodiments, a plurality of signal transmission lines is arranged in rows and a plurality of signal transmission lines is arranged in columns, such that the plurality of signal transmission lines arranged in columns intersect with the plurality of signal transmission lines arranged in rows at the plurality of intersection points. The plurality of thyristor switches are embedded in a lower dielectric layer of a dielectric stack. The dielectric stack includes the lower dielectric layer and an upper dielectric layer. Each of the plurality of thyristor switches has a top and a bottom.

In step 1210, each of the plurality of thyristor switches is placed into electrical contact with the signal transmission lines that intersect at the associated intersection point. In step 1215, a first ground plane is positioned between the dielectric stack and a substrate. The substrate includes a first semiconductor. In step 1220, a plurality of apertures is inserted in the first ground plane. In step 1225, each of the plurality of thyristor switches is associated with one of the plurality of apertures. In step 1230, a width of each of the plurality of signal transmission lines is selected, such that each of the plurality of signal transmission lines has an impedance substantially equal to a load.

Figure 13:
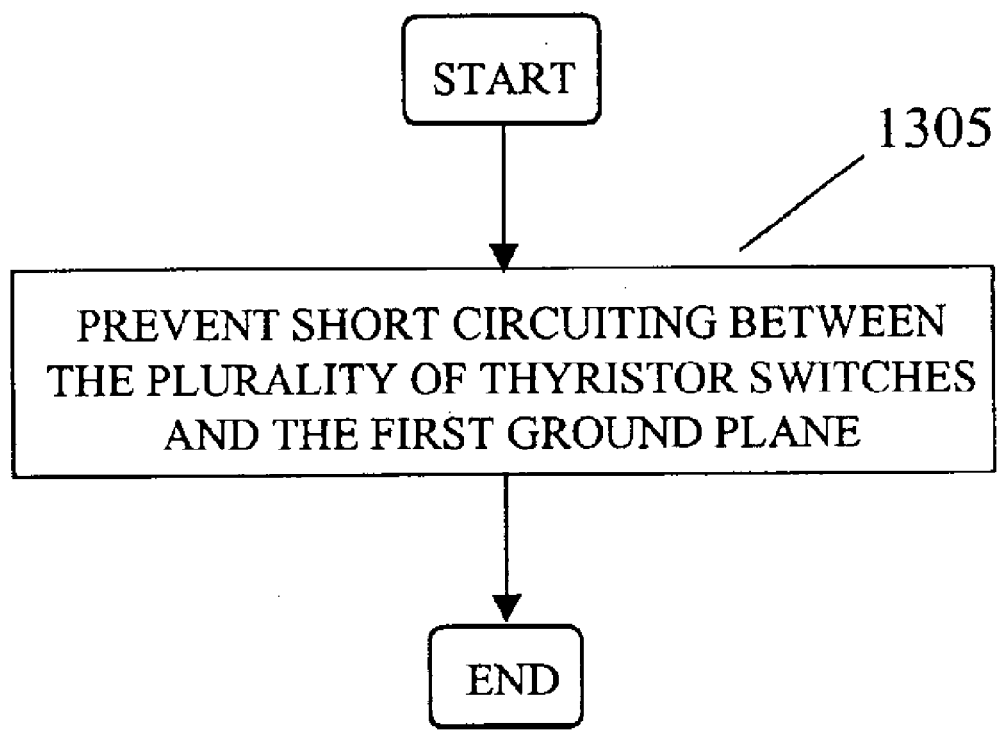
FIG. 13 is a flowchart illustrating a step for preventing short circuiting, in accordance with an exemplary embodiment of the present invention.

FIG. 13 is a flowchart illustrating a step for preventing short circuiting, in accordance with an exemplary embodiment of the present invention. For the step 1225 of associating each of the plurality of thyristor switches with one of the plurality of apertures, short circuiting between the plurality of thyristor switches and the first ground plane is prevented by positioning each of the plurality of thyristor switches inside one of the plurality of apertures.

Figure 14:
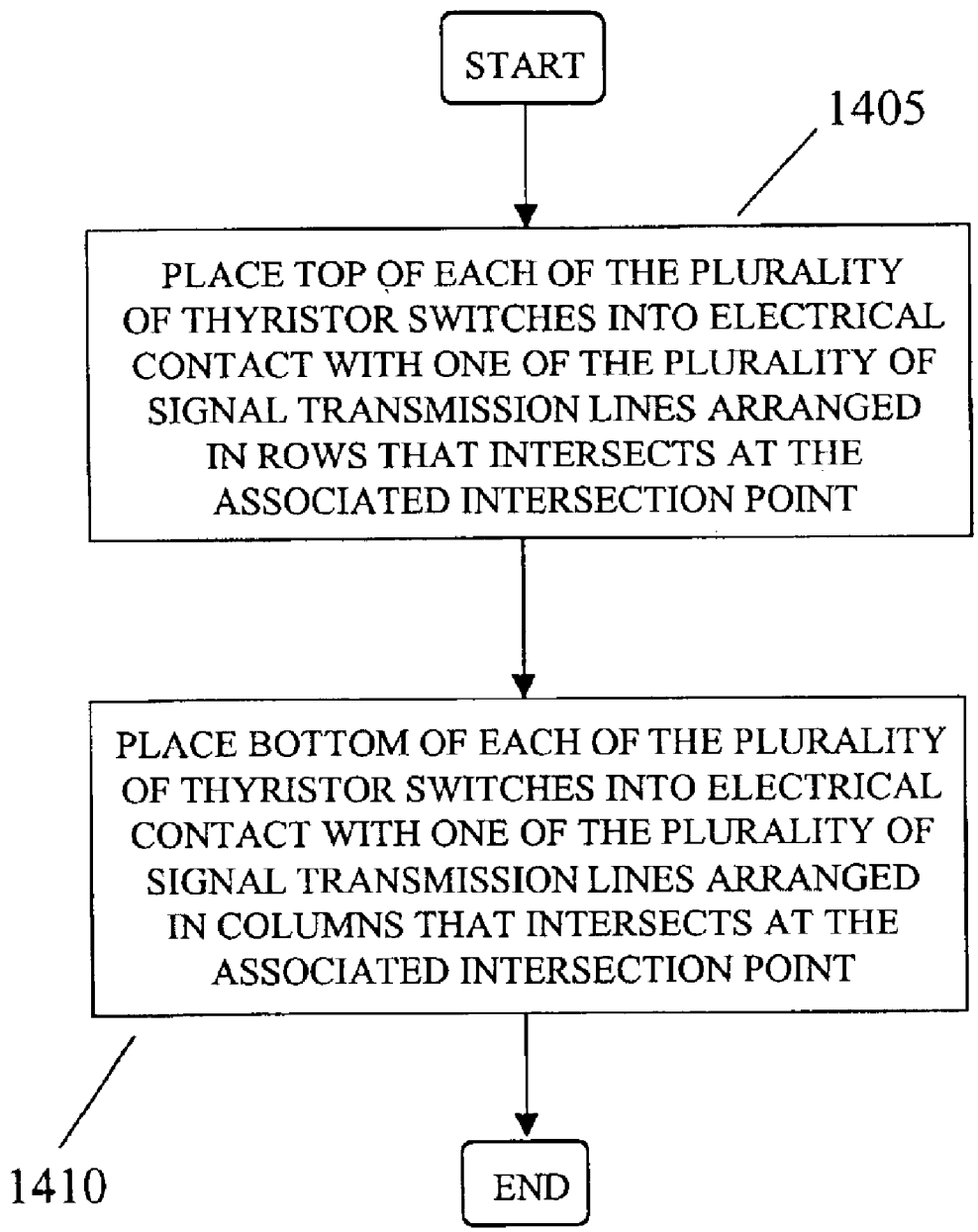
FIG. 14 is a flowchart illustrating steps for placing each of the plurality of thyristor switches into electrical contact with the signal transmission lines that intersect at the associated intersection point, in accordance with an exemplary embodiment of the present invention.

FIG. 14 is a flowchart illustrating steps for placing each of the plurality of thyristor switches into electrical contact with the signal transmission lines that intersect at the associated intersection point, in accordance with an exemplary embodiment of the present invention. In step 1405, the top of each of the plurality of thyristor switches is placed into electrical contact with one of the plurality of signal transmission lines arranged in rows that intersects at the associated intersection point. In step 1410, the bottom of each of the plurality of thyristor switches is placed into electrical contact with one of the plurality of signal transmission lines arranged in columns that intersects at the associated intersection point.

Figure 15:
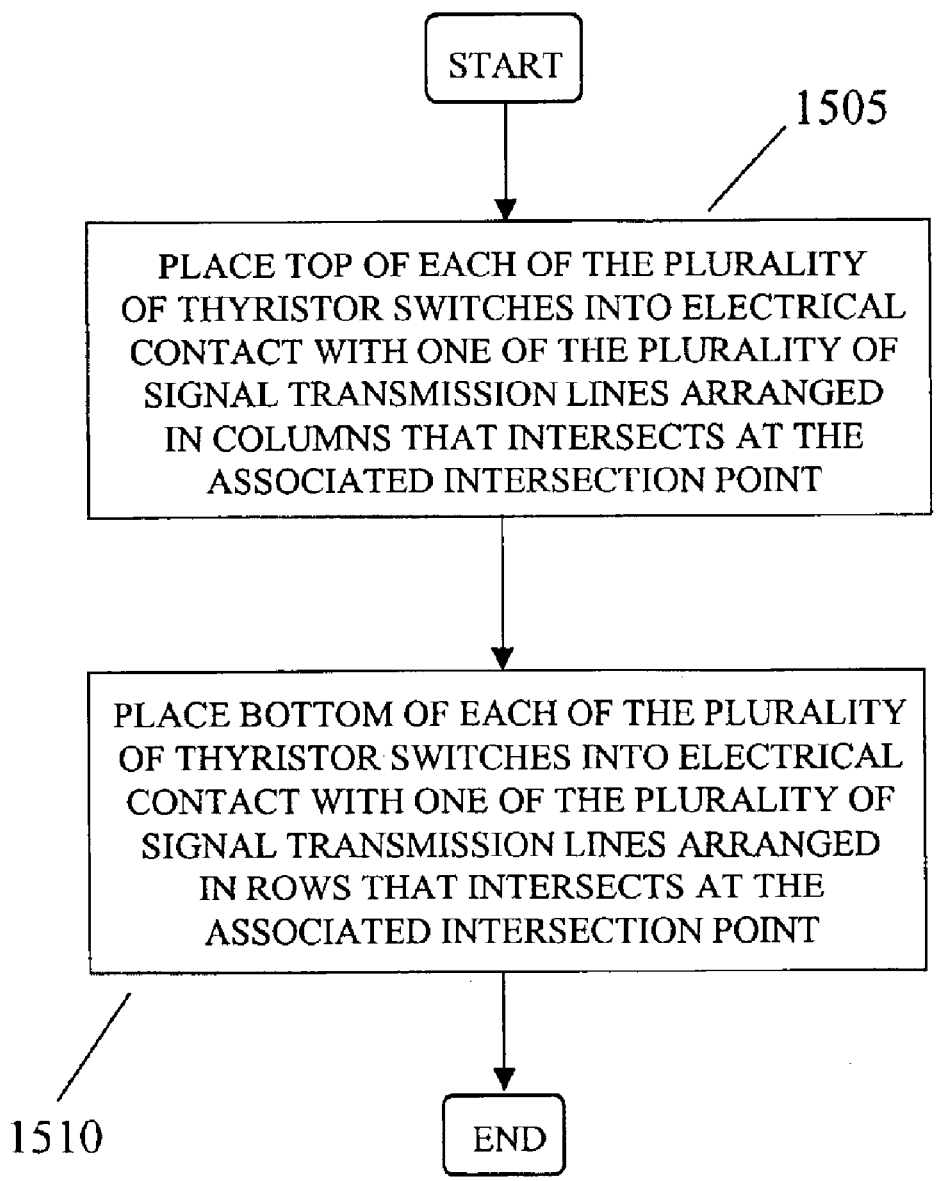
FIG. 15 is a flowchart illustrating steps for placing each of the plurality of thyristor switches into electrical contact with the signal transmission lines that intersect at the associated intersection point, in accordance with an alternative exemplary embodiment of the present invention.

FIG. 15 is a flowchart illustrating steps for placing each of the plurality of thyristor switches into electrical contact with the signal transmission lines that intersect at the associated intersection point, in accordance with an alternative exemplary embodiment of the present invention. In step 1505, the top of each of the plurality of thyristor switches is placed into electrical contact with one of the plurality of signal transmission lines arranged in columns that intersects at the associated intersection point. In step 1510, the bottom of each of the plurality of thyristor switches is placed into electrical contact with one of the plurality of signal transmission lines arranged in rows that intersects at the associated intersection point.

Figure 16:
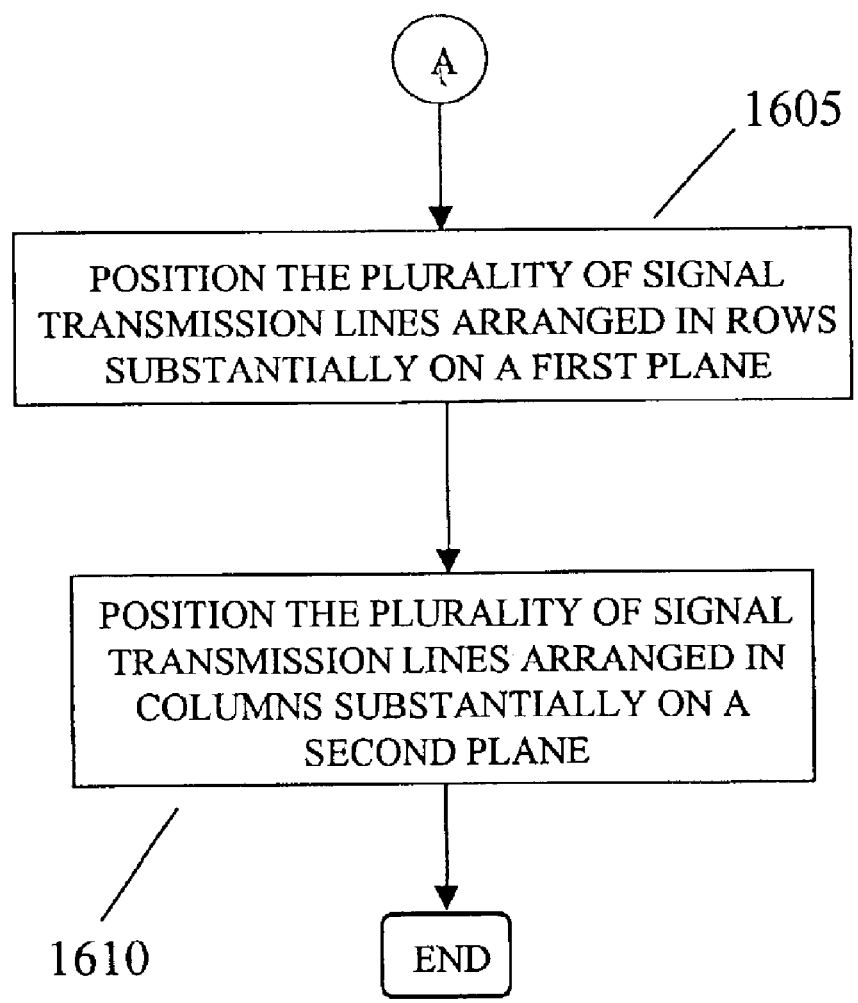
FIG. 16 is a flowchart illustrating additional steps for reducing crosstalk and dispersion in a crosspoint MMIC switch array, in accordance with an alternative exemplary embodiment of the present invention.

FIG. 16 is a flowchart illustrating additional steps for reducing crosstalk and dispersion in a crosspoint MMIC switch array, in accordance with an alternative exemplary embodiment of the present invention. In step 1605, the plurality of signal transmission lines arranged in rows is positioned substantially on a first plane. In step 1610, the plurality of signal transmission lines arranged in columns is positioned substantially on a second plane. According to this alternative exemplary embodiment, the first plane is substantially parallel to the second plane.

Figure 17:
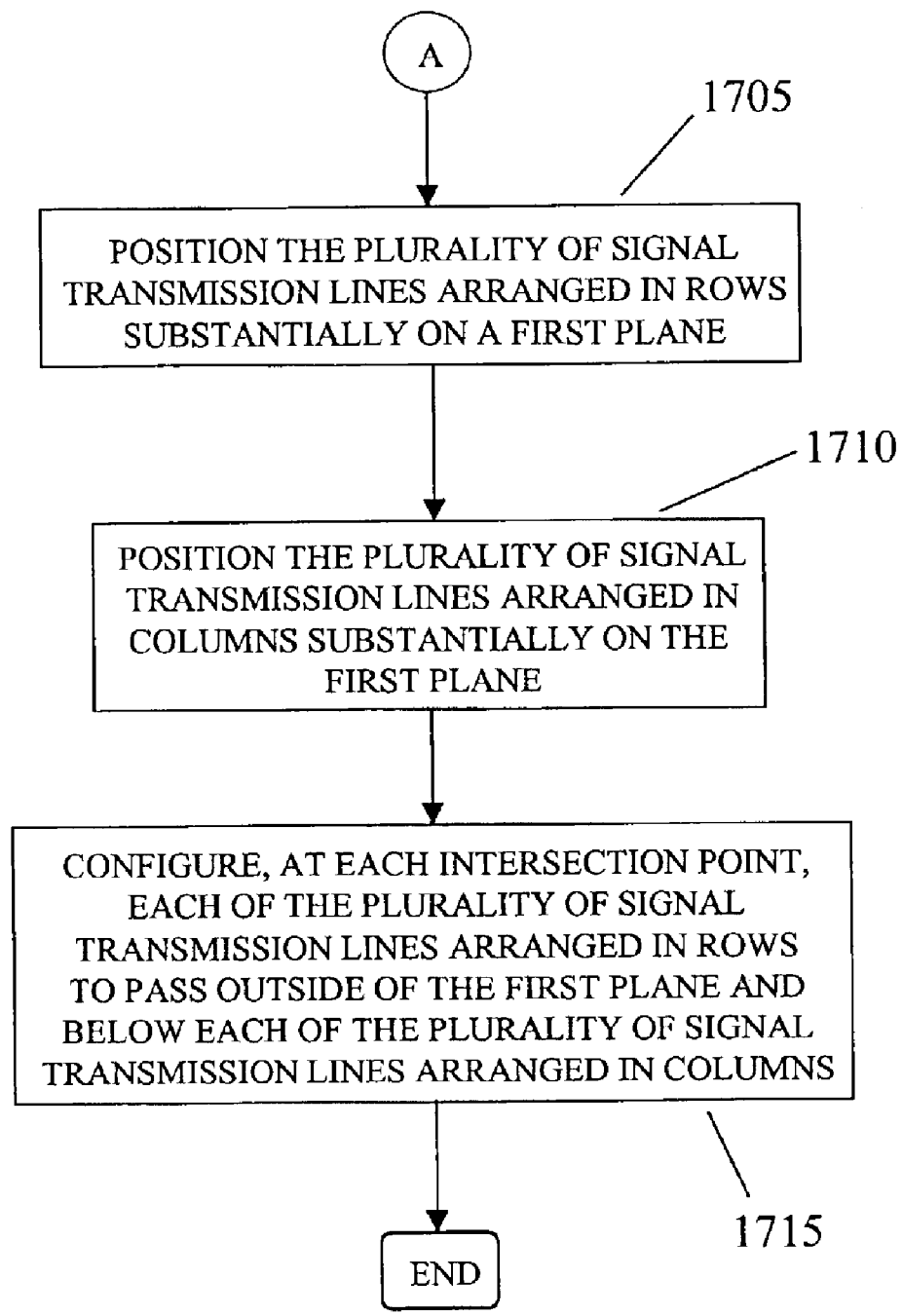
FIG. 17 is a flowchart illustrating additional steps for reducing crosstalk and dispersion in a crosspoint MMIC switch array, in accordance with an alternative exemplary embodiment of the present invention.

FIG. 17 is a flowchart illustrating additional steps for reducing crosstalk and dispersion in a crosspoint MMIC switch array, in accordance with an alternative exemplary embodiment of the present invention. In step 1705, the plurality of signal transmission lines arranged in rows is positioned substantially on a first plane. In step 1710, the plurality of signal transmission lines arranged in columns is positioned substantially on the first plane. In step 1715, at each associated intersection point, each of the plurality of signal transmission lines arranged in rows is configured to pass outside of the first plane and below each of the plurality of signal transmission lines arranged in columns.

Figure 18:
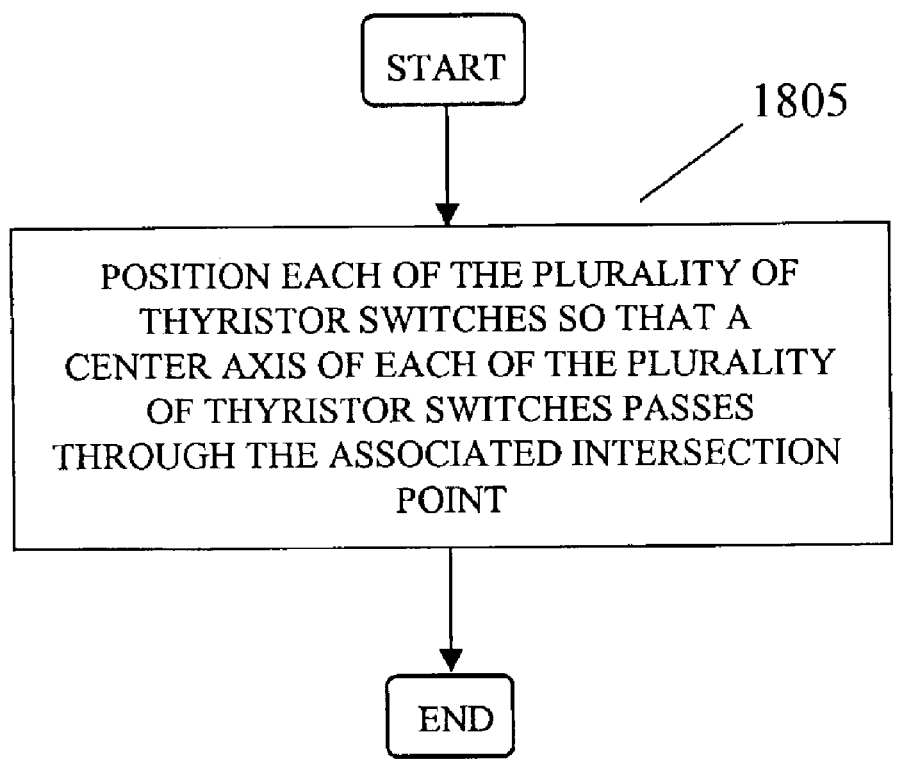
FIG. 18 is a flowchart illustrating a step for associating each of the plurality of thyristor switches with one of the plurality of intersection points, in accordance with an exemplary embodiment of the present invention.
Figure 19:
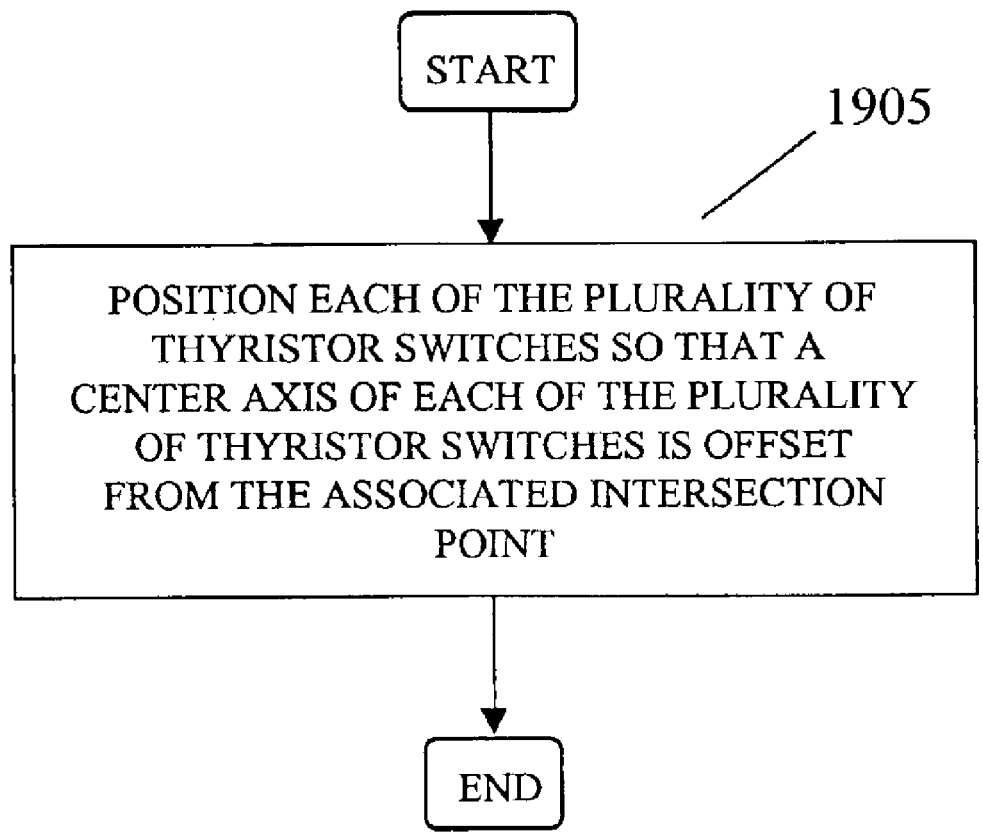
FIG. 19 is a flowchart illustrating a step for associating each of the plurality of thyristor switches with one of the plurality of intersection points, in accordance with an alternative exemplary embodiment of the present invention.

FIG. 18 is a flowchart illustrating a step for associating each of the plurality of thyristor switches with one of the plurality of intersection points, in accordance with an exemplary embodiment of the present invention. In step 1805, each of the plurality of thyristor switches is positioned so that a center axis of each of the plurality of thyristor switches passes through the associated intersection point. FIG. 19 is a flowchart illustrating a step for associating each of the plurality of thyristor switches with one of the plurality of intersection points, in accordance with an alternative exemplary embodiment of the present invention. In step 1905, each of the plurality of thyristor switches is positioned so that a center axis of each of the plurality of thyristor switches is offset from the associated intersection point. According to this alternative exemplary embodiments, the center axis of each of the plurality of thyristor switches can be offset from the associated intersection point by any amount and in any manner.

Figure 20:
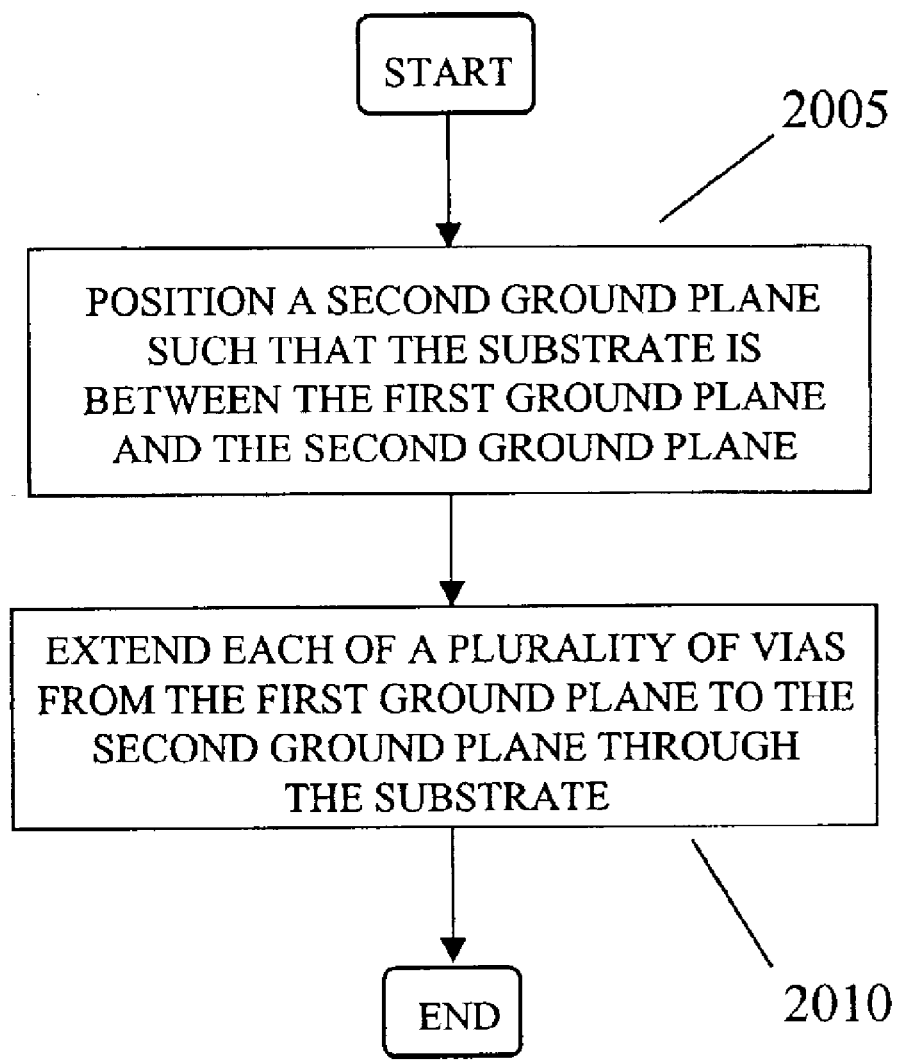
FIG. 20 is a flowchart illustrating an steps for reducing crosstalk and dispersion in a crosspoint MMIC switch array, in accordance with an exemplary embodiment of the present invention.

FIG. 20 is a flowchart illustrating steps for reducing crosstalk and dispersion in a crosspoint MMIC switch array, in accordance with an exemplary embodiment of the present invention. In step 2005, a second ground plane can be positioned such that the substrate is between the first ground plane and the second ground plane. In step 2010, each of a plurality of vias can be extended from the first ground plane to the second ground plane through the substrate.

Figure 21:
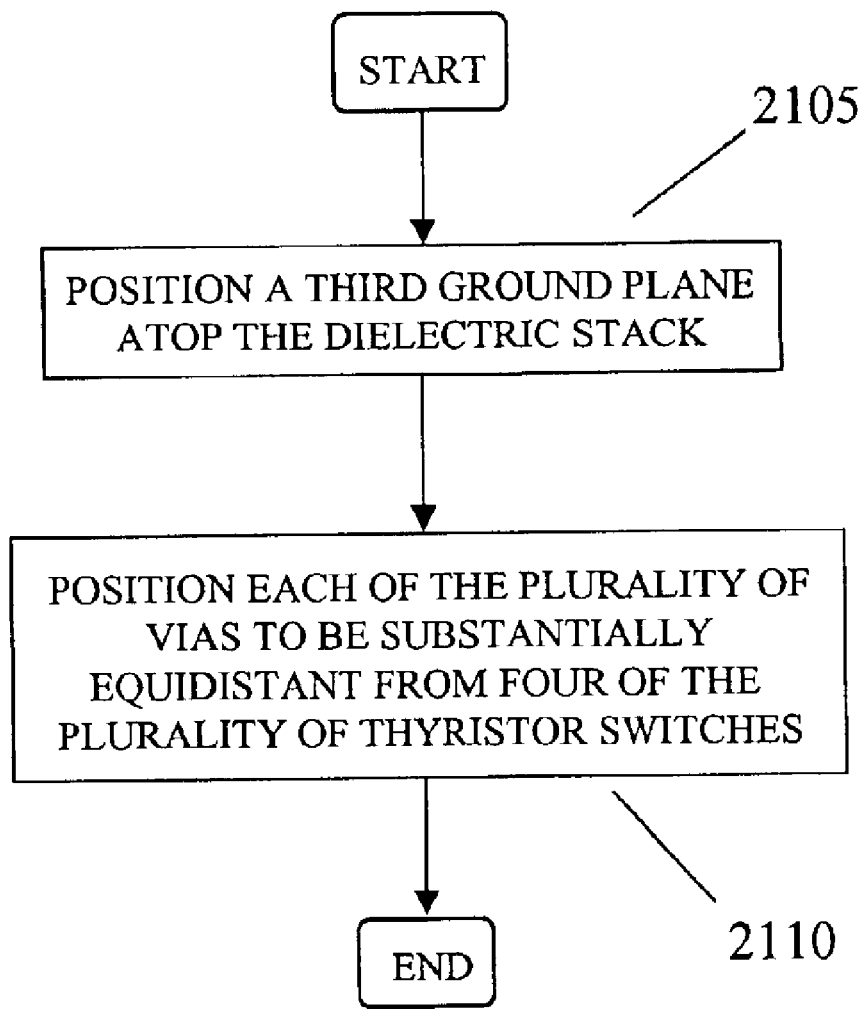
FIG. 21 is a flowchart illustrating additional steps for reducing crosstalk and dispersion in a crosspoint MMIC switch array, in accordance with an exemplary embodiment of the present invention.

FIG. 21 is a flowchart illustrating additional steps for reducing crosstalk and dispersion in a crosspoint MMIC switch array, in accordance with an exemplary embodiment of the present invention. In step 2105, a third ground plane is positioned atop the dielectric stack. In step 2110, each of the plurality of vias is positioned to be substantially equidistant from four of the plurality of thyristor switches. Each of the plurality of vias can be arranged in any manner to be substantially equidistant from four of the plurality of thyristor switches.

According to exemplary embodiments, the first semiconductor can comprise gallium arsenide (GaAs). According to an alternative exemplary embodiment, the first semiconductor can comprise silicon. The dielectric stack can comprise benzocyclobutene. The frequency range of operation extends from DC to microwave frequencies (approximately 300 MHz to approximately 300 GHz).

It will be appreciated by those of ordinary skill in the art that the present invention can be embodied in various specific forms without departing from the spirit or essential characteristics thereof. For example, it is to be understood that although a preferred embodiment of the invention does not include an upper ground plane, such as in the design 300 of FIG. 3, an upper ground plane can also be incorporated into the present invention. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A crosspoint monolithic microwave integrated circuit (MMIC) switch array, wherein the crosspoint MMIC switch array operates in a range between DC and microwave frequencies, the crosspoint MMIC switch array comprising:
    a dielectric stack, including an upper dielectric layer and a lower dielectric layer;
    a substrate, including a first semiconductor;
    a first ground plane, the first ground plane being positioned between the dielectric stack and the substrate;
    a plurality of thyristor switches, the plurality of thyristor switches being embedded in the lower dielectric layer, and each of the plurality of thyristor switches including a top and a bottom;
    a plurality of signal transmission lines arranged in rows;
    a plurality of signal transmission lines arranged in columns, wherein the plurality of signal transmission lines arranged in columns intersect the plurality of signal transmission lines arranged in rows at a plurality of intersection points,
        wherein each of the plurality of thyristor switches is associated with one of the plurality of intersection points,
        wherein each of the plurality of thyristor switches is in electrical contact with the signal transmission lines that intersect at the associated intersection point, and
        wherein the first ground plane includes a plurality of apertures, each of the plurality of thyristor switches being associated with one of the plurality of apertures.

2. The crosspoint MMIC switch array of claim 1, wherein each of the plurality of thyristor switches is positioned inside one of the plurality of apertures, such that short circuiting between the plurality of thyristor switches and the first ground plane is prevented.

3. The crosspoint MMIC switch array of claim 1, wherein for each of the plurality of thyristor switches that is in electrical contact with the signal transmission lines that intersect at the associated intersection point,
    the top of each of the plurality of thyristor switches is in electrical contact with one of the plurality of signal transmission lines arranged in rows that intersects at the associated intersection point, and
    the bottom of each of the plurality of thyristor switches is in electrical contact with one of the plurality of signal transmission lines arranged in columns that intersects at the associated intersection point.

4. The crosspoint MMIC switch array of claim 1, wherein for each of the plurality of thyristor switches being in electrical contact with the signal transmission lines that intersect at the associated intersection point,
    the top of each of the plurality of thyristor switches is in electrical contact with one of the plurality of signal transmission lines arranged in columns that intersects at the associated intersection point, and
    the bottom of each of the plurality of thyristor switches is in electrical contact with one of the plurality of signal transmission lines arranged in rows that intersects at the associated intersection point.

5. The crosspoint MMIC switch array of claim 1, wherein the plurality of signal transmission lines arranged in rows are positioned substantially on a first plane, and the plurality of signal transmission lines arranged in columns are positioned substantially on a second plane, and the first plane is substantially parallel to the second plane.

6. The crosspoint MMIC switch array of claim 1, wherein the plurality of signal transmission lines arranged in rows are positioned substantially on a first plane, and the plurality of signal transmission lines arranged in columns are positioned substantially on the first plane, and at each of the plurality of intersection points, each of the plurality of signal transmission lines arranged in rows is configured to pass outside of the first plane and below each of the plurality of signal transmission lines arranged in columns.

7. The crosspoint MMIC switch array of claim 1, wherein each of the plurality of thyristor switches is positioned so that a center axis of each of the plurality of thyristor switches passes through the associated intersection point.

8. The crosspoint MMIC switch array of claim 1, wherein each of the plurality of thyristor switches is positioned so that a center axis of each of the plurality of thyristor switches is offset from the associated intersection point.

9. The crosspoint MMIC switch array of claim 1, comprising:
    a second ground plane, the second ground plane being positioned such that the substrate is between the first ground plane and the second ground plane; and
    a plurality of vias, each of the plurality of vias extending from the first ground plane to the second ground plane through the substrate.

10. The crosspoint MMIC switch array of claim 9, wherein a third ground plane is placed atop the dielectric stack.

11. The crosspoint MMIC switch array of claim 9, wherein each of the plurality of vias is positioned substantially equidistant from four of the plurality of thyristor switches.

12. The crosspoint MMIC switch array of claim 1, wherein the first semiconductor comprises gallium arsenide (GaAs).

13. The crosspoint MMIC switch array of claim 1, wherein the first semiconductor comprises silicon.

14. The crosspoint MMIC switch array of claim 1, wherein the dielectric stack comprises benzocyclobutene.

15. The crosspoint MMIC switch array of claim 1, wherein a width of each of the plurality of signal transmission lines is chosen such that each of the plurality of signal transmission lines has an impedance substantially equal to a load.

16. The crosspoint MMIC switch array of claim 1, wherein the dielectric stack comprises two different dielectric materials, wherein the two different dielectric materials have substantially equal dielectric constants.

17. An apparatus for reducing crosstalk and dispersion in a crosspoint monolithic microwave integrated circuit (MMIC) switch array, wherein the crosspoint MMIC switch array operates in a range between DC and microwave frequencies, the crosspoint MMIC switch array comprising:
    a dielectric stack, including an upper dielectric layer and a lower dielectric layer;
    a substrate, including a first semiconductor;
    a first ground plane;
    a plurality of thyristor switches, the plurality of thyristor switches being embedded in the lower dielectric layer, and each of the plurality of thyristor switches having a top and a bottom;
    a plurality of signal transmission lines arranged in rows; and
    a plurality of signal transmission lines arranged in columns, such that the plurality of signal transmission lines arranged in columns intersect the plurality of signal transmission lines arranged in rows at a plurality of intersection points;

and the apparatus comprising:

means for associating each of the plurality of thyristor switches with one of the plurality of intersection points;

means for placing each of the plurality of thyristor switches into electrical contact with the signal transmission lines that intersect at the associated intersection point;

means for positioning the first ground plane between the dielectric stack and the substrate;

means for inserting a plurality of apertures in the first ground plane; and means for associating each of the plurality of thyristor switches with one of the plurality of apertures.

18. The apparatus of claim 17, wherein the means for associating each of the plurality of thyristor switches with one of the plurality of apertures comprises means for preventing short circuiting between the plurality of thyristor switches and the first ground plane, wherein each of the plurality of thyristor switches is positioned inside one of the plurality of apertures.

19. The apparatus of claim 17, wherein the means for placing each of the plurality of thyristor switches into electrical contact with the signal transmission lines that intersect at the associated intersection point comprises:

means for placing the top of each of the plurality of thyristor switches into electrical contact with one of the plurality of signal transmission lines arranged in rows that intersects at the associated intersection point; and means for placing the bottom of each of the plurality of thyristor switches into electrical contact with one of the plurality of the signal transmission lines arranged in columns that intersects at the associated intersection point.

20. The apparatus of claim 17, wherein the means for placing each of the plurality of thyristor switches into electrical contact with the signal transmission lines that intersect at the associated intersection comprises:

means for placing the top of each of the plurality of thyristor switches into electrical contact with one of the plurality of signal transmission lines arranged in columns that intersects at the associated intersection point; and means for placing the bottom of each of the plurality of thyristor switches into electrical contact with one of the plurality of signal transmission lines arranged in rows that intersects at the associated intersection point.

21. The apparatus of claim 17, comprising:

means for positioning the plurality of signal transmission lines arranged in rows substantially on a first plane; and means for positioning the plurality of signal transmission lines arranged in columns substantially on a second plane, wherein the first plane is substantially parallel to the second plane.

22. The apparatus of claim 17, comprising:

means for positioning the plurality of signal transmission lines arranged in rows substantially on a first plane;

means for positioning the plurality of signal transmission lines arranged in columns substantially on the first plane; and at each associated intersection point, means for configuring each of the plurality of signal transmission lines arranged in rows to pass outside of the first plane and below each of the plurality of signal transmission lines arranged in columns.

23. The apparatus of claim 17, wherein the means for associating each of the plurality of thyristor switches with one of the plurality of intersection points comprises means for positioning each of the plurality of thyristor switches so that a center axis of each of the plurality of thyristor switches passes through the associated intersection point.

24. The apparatus of claim 17, wherein the means for associating each of the plurality of thyristor switches with one of the plurality of intersection points comprises means for positioning each of the plurality of thyristor switches so that a center axis of each of the plurality of thyristor switches is offset from the associated intersection point.

25. The apparatus of claim 17, the array comprising:

a second ground plane, the second ground plane being positioned such that the substrate is between the first ground plane and the second ground plane; and a plurality of vias, each of the plurality of vias extending from the first ground plane to the second ground plane through the substrate.

26. The apparatus of claim 25, wherein a third ground plane is placed atop the dielectric stack.

27. The apparatus of claim 25, comprising:

means for positioning each of the plurality of vias to be substantially equidistant from four of the plurality of thyristor switches.

28. The apparatus of claim 17, wherein the first semiconductor comprises gallium arsenide.

29. The apparatus of claim 17, wherein the first semiconductor comprises silicon.

30. The apparatus of claim 17, wherein the dielectric stack comprises benzocyclobutene.

31. The apparatus of claim 17, comprising:

means for selecting a width of each of the plurality of signal transmission lines such that each of the plurality of signal transmission lines has an impedance substantially equal to a load.

32. The apparatus of claim 17, wherein the dielectric stack comprises two different dielectric materials, wherein the two different dielectric materials have substantially equal dielectric constants.

33. A method of reducing crosstalk and dispersion in a crosspoint monolithic microwave integrated circuit (MMIC) switch array operating in a range between DC and microwave frequencies, comprising the steps of:

associating each of a plurality of thyristor switches with one of a plurality of intersection points, wherein a plurality of signal transmission lines is arranged in rows and a plurality of signal transmission lines is arranged in columns, such that the plurality of signal transmission lines arranged in columns intersect with the plurality of signal transmission lines arranged in rows at the plurality of intersection points, wherein the plurality of thyristor switches are embedded in a lower dielectric layer of a dielectric stack, wherein the dielectric stack includes the lower dielectric layer and an upper dielectric layer, and wherein each of the plurality of thyristor switches has a top and a bottom;

placing each of the plurality of thyristor switches into electrical contact with the signal transmission lines that intersect at the associated intersection point;

positioning a first ground plane between the dielectric stack and the substrate, wherein the substrate includes a first semiconductor;

inserting a plurality of apertures in the first ground plane;

associating each of the plurality of thyristor switches with one of the plurality of apertures; and selecting a width of each of the plurality of signal transmission lines such that each of the plurality of signal transmission lines has an impedance substantially equal to that of a load.

34. The method of claim 33, wherein the step of associating each of the plurality of thyristor switches with one of the plurality of apertures comprises the step of:

preventing short circuiting between the plurality of thyristor switches and the first ground plane by positioning each of the plurality of thyristor switches inside one of the plurality of apertures.

35. The method of claim 33, wherein the step of placing each of the plurality of thyristor switches into electrical contact with the signal transmission lines that intersect at the associated intersection point comprises the steps of:

placing the top of each of the plurality of thyristor switches into electrical contact with one of the plurality of signal transmission lines arranged in rows that intersects at the associated intersection point; and placing the bottom of each of the plurality of thyristor switches into electrical contact with one of the plurality of signal transmission lines arranged in columns that intersects at the associated intersection point.

36. The method of claim 33, wherein the step of placing each of the plurality of thyristor switches into electrical contact with the signal transmission lines that intersect at the associated intersection point comprises the steps of:

placing the top of each of the plurality of thyristor switches into electrical contact with one of the plurality of signal transmission lines arranged in columns that intersects at the associated intersection point; and placing the bottom of each of the plurality of thyristor switches into electrical contact with one of the plurality of signal transmission lines arranged in rows that intersects at the associated intersection point.

37. The method of claim 33, comprising the steps of:

positioning the plurality of signal transmission lines arranged in rows substantially on a first plane; and positioning the plurality of signal transmission lines arranged in columns substantially on a second plane, wherein the first plane is substantially parallel to the second plane.

38. The method of claim 33, comprising the steps of:

positioning the plurality of signal transmission lines arranged in rows substantially on a first plane;

positioning the plurality of signal transmission lines arranged in columns substantially on the first plane; and at each associated intersection point, configuring each of the plurality of signal transmission lines arranged in rows to pass outside of the first plane and below each of the plurality of signal transmission lines arranged in columns.

39. The method of claim 33, wherein the step of associating each of the plurality of thyristor switches with one of the plurality of intersection points comprises the step of:

positioning each of the plurality of thyristor switches so that a center axis of each of the plurality of thyristor switches passes through the associated intersection point.

40. The method of claim 33, wherein the step of associating each of the plurality of thyristor switches with one of the plurality of intersection points comprises the step of:

positioning each of the plurality of thyristor switches so that a center axis of each of the plurality of thyristor switches is offset from the associated intersection point.

41. The method of claim 33, comprising the steps of:

positioning a second ground plane such that the substrate is between the first ground plane and the second ground plane; and extending each of a plurality of vias from the first ground plane to the second ground plane through the substrate.

42. The method of claim 41, further comprising the step of:

positioning a third ground plane atop the dielectric stack.

43. The method of claim 41, further comprising the step of:

positioning each of the plurality of vias to be substantially equidistant from four of the plurality of thyristor switches.

44. The method of claim 33, wherein the first semiconductor comprises gallium arsenide.

45. The method of claim 33, wherein the first semiconductor comprises silicon.

46. The method of claim 33, wherein the dielectric stack comprises benzocyclobutene.

47. The method of claim 33, wherein the dielectric stack comprises two different dielectric materials, wherein the two different dielectric materials have substantially equal dielectric constants.

* * * * *